United States Patent
Kim et al.

(10) Patent No.: US 11,524,482 B2
(45) Date of Patent: Dec. 13, 2022

(54) DECORATION MEMBER AND METHOD FOR PRODUCING SAME

(71) Applicant: LG CHEM, LTD., Seoul (KR)

(72) Inventors: Yong Chan Kim, Daejeon (KR); Ki Hwan Kim, Daejeon (KR); Nansra Heo, Daejeon (KR); Jeong Woo Shon, Daejeon (KR); Pilsung Jo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 179 days.

(21) Appl. No.: 16/767,530

(22) PCT Filed: Dec. 12, 2018

(86) PCT No.: PCT/KR2018/015787
§ 371 (c)(1),
(2) Date: May 27, 2020

(87) PCT Pub. No.: WO2019/117626
PCT Pub. Date: Jun. 20, 2019

(65) Prior Publication Data
US 2021/0170785 A1 Jun. 10, 2021

(30) Foreign Application Priority Data
Dec. 15, 2017 (KR) .................. 10-2017-0173250

(51) Int. Cl.
*B32B 3/10* (2006.01)
*B32B 7/023* (2019.01)
(Continued)

(52) U.S. Cl.
CPC .............. *B32B 7/023* (2019.01); *A45D 33/18* (2013.01); *B32B 1/00* (2013.01); *B32B 3/30* (2013.01);
(Continued)

(58) Field of Classification Search
None
See application file for complete search history.

(56) References Cited

U.S. PATENT DOCUMENTS 6,344,288 B1  2/2002  Oyama et al.
7,923,122 B2  4/2011  Korechika et al.
(Continued)

FOREIGN PATENT DOCUMENTS

CN          2056903 U      5/1990
CN        101666886 A      3/2010
(Continued)

OTHER PUBLICATIONS

Machine translation of KR-2015114625-A on Jan. 28, 2022.*
(Continued)

*Primary Examiner* — Christopher M Polley
(74) *Attorney, Agent, or Firm* — Dentons US LLP

(57) ABSTRACT

A decoration element including a color developing layer including a light reflective layer, and a light absorbing layer provided on the light reflective layer; and an in-mold label layer provided on one surface of the color developing layer. The light absorbing layer includes a convex portion shape or concave portion shape having an asymmetric cross-section.

12 Claims, 21 Drawing Sheets

(51) Int. Cl.
- *B32B 3/30* (2006.01)
- *B32B 27/28* (2006.01)
- *C23C 14/06* (2006.01)
- *C23C 14/34* (2006.01)
- *G02B 1/02* (2006.01)
- *G02B 5/00* (2006.01)
- *G02B 5/08* (2006.01)
- *A45D 33/18* (2006.01)
- *B44F 1/02* (2006.01)
- *C23C 14/00* (2006.01)
- *G02B 5/28* (2006.01)
- *B32B 1/00* (2006.01)
- *B44C 3/02* (2006.01)
- *B44F 1/04* (2006.01)
- *B44F 1/08* (2006.01)
- *G02F 1/153* (2006.01)

(52) U.S. Cl.
CPC .............. *B32B 27/281* (2013.01); *B44C 3/02* (2013.01); *B44F 1/02* (2013.01); *B44F 1/045* (2013.01); *B44F 1/08* (2013.01); *C23C 14/0036* (2013.01); *C23C 14/0676* (2013.01); *C23C 14/34* (2013.01); *G02B 1/02* (2013.01); *G02B 5/003* (2013.01); *G02B 5/0816* (2013.01); *G02B 5/28* (2013.01); *G02F 1/153* (2013.01); *B32B 2307/402* (2013.01); *B32B 2451/00* (2013.01)

(56) References Cited

U.S. PATENT DOCUMENTS

| | | |
|---|---|---|
| 2003/0031842 A1 | 2/2003 | Marietti et al. |
| 2005/0175815 A1 | 8/2005 | Wild et al. |
| 2006/0285184 A1 | 12/2006 | Phillips et al. |
| 2010/0060987 A1 | 3/2010 | Witzman et al. |
| 2011/0262713 A1 | 10/2011 | Nakao et al. |
| 2013/0034693 A1 | 2/2013 | Fujii et al. |
| 2013/0048072 A1 | 2/2013 | Choi |
| 2014/0377522 A1 | 12/2014 | Koch, III et al. |
| 2015/0212244 A1 | 7/2015 | Kim et al. |
| 2017/0052295 A1 | 2/2017 | Sakuma et al. |
| 2017/0197874 A1 | 7/2017 | Dumont et al. |
| 2017/0349998 A1 | 12/2017 | Yoshinari et al. |
| 2018/0164932 A1 | 6/2018 | Park et al. |
| 2018/0224960 A1 | 8/2018 | Park et al. |
| 2018/0355467 A1 | 12/2018 | Lee et al. |
| 2019/0098946 A1 | 4/2019 | Bee et al. |

FOREIGN PATENT DOCUMENTS

| | | |
|---|---|---|
| CN | 102971862 A | 3/2013 |
| CN | 104602909 A | 5/2015 |
| CN | 106662950 A | 5/2017 |
| CN | 107140827 A | 9/2017 |
| EP | 1162059 A2 | 12/2001 |
| EP | 2352042 A1 | 8/2011 |
| EP | 2891554 A1 | 7/2015 |
| EP | 2952360 A1 | 12/2015 |
| EP | 3073353 A1 | 9/2016 |
| EP | 3647053 A1 | 5/2020 |
| IN | 20171706352 | 6/2017 |
| JP | 3-86646 A | 4/1991 |
| JP | 2000-47613 A | 2/2000 |
| JP | 2006350355 A | 12/2006 |
| JP | 2008083599 A | 4/2008 |
| JP | 2008-225293 A | 9/2008 |
| JP | 2008-229997 A | 10/2008 |
| JP | 2009083183 A | 4/2009 |
| JP | 2009120129 A | 6/2009 |
| JP | 2009269222 A | 11/2009 |
| JP | 2010-173273 A | 8/2010 |
| JP | 2010-197798 A | 9/2010 |
| JP | 2011-056683 A | 3/2011 |
| JP | 2011-170295 A | 9/2011 |
| JP | 2011-173379 A | 9/2011 |
| JP | 5016722 B2 | 6/2012 |
| JP | 2013037040 A | 2/2013 |
| JP | 2015533678 A | 11/2015 |
| JP | 2016-079051 A | 5/2016 |
| JP | 2017-526604 A | 9/2017 |
| JP | 2017220150 A | 12/2017 |
| KR | 10-0563419 B1 | 3/2006 |
| KR | 10-2008-0078523 A | 8/2008 |
| KR | 10-2015-0086329 A | 7/2015 |
| KR | 10-2015-0114625 A | 10/2015 |
| KR | 2015114625 A * | 10/2015 |
| KR | 10-2017-0008572 A | 1/2017 |
| KR | 10-2017-0086294 A | 7/2017 |
| TW | 200944394 A1 | 11/2009 |
| WO | 2016136117 A1 | 9/2016 |
| WO | 2017-099476 A1 | 6/2017 |
| WO | 2017/104138 A1 | 6/2017 |

OTHER PUBLICATIONS

Guangjiaoshili, "Digital SLR Shooting Tips-Composition", Oct. 2010, (3 Pages).

Yunxing Ling and Shenglian Xue, "Technical Manual 1 for Painting Ink", May 2009 (4 Pages).

* cited by examiner

【FIG. 1】
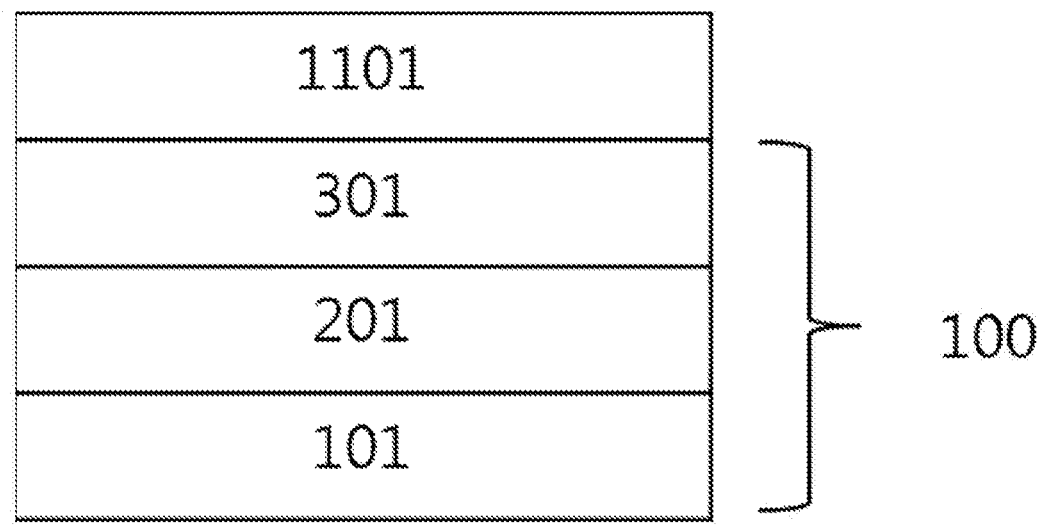
【FIG. 2】
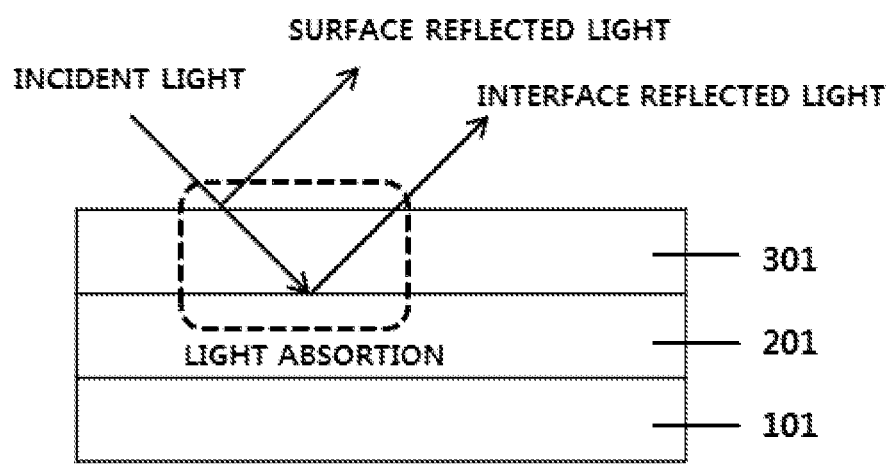

【FIG. 3】
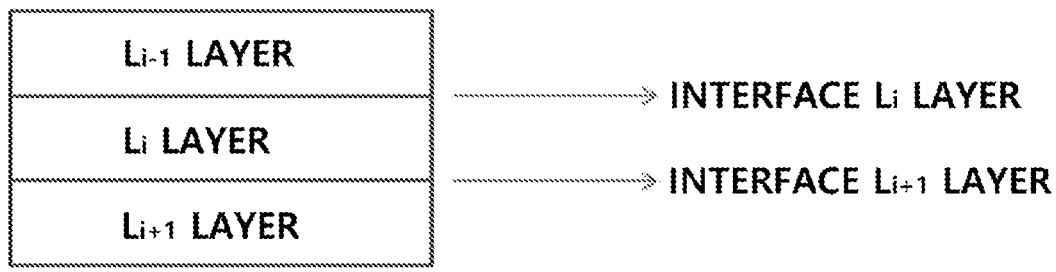
【FIG. 4】
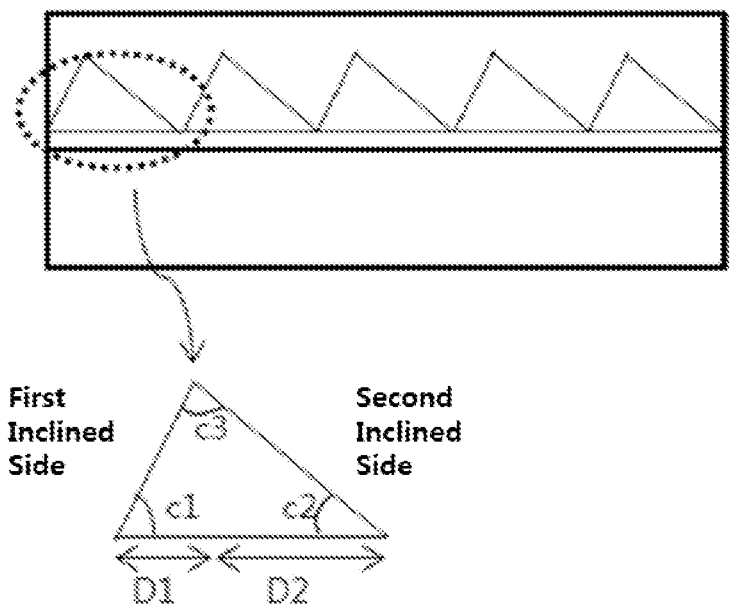

[FIG. 5A]
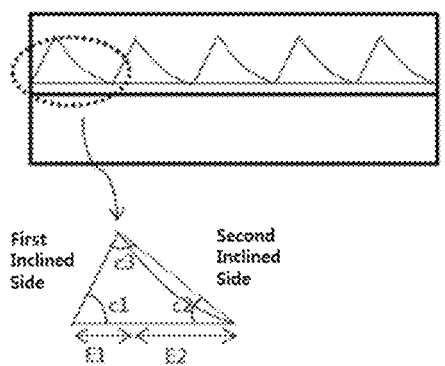
[FIG. 5B]
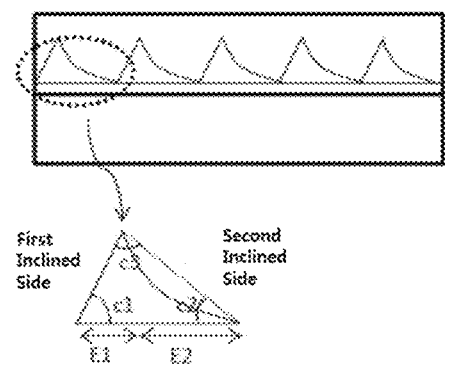
[FIG. 6]
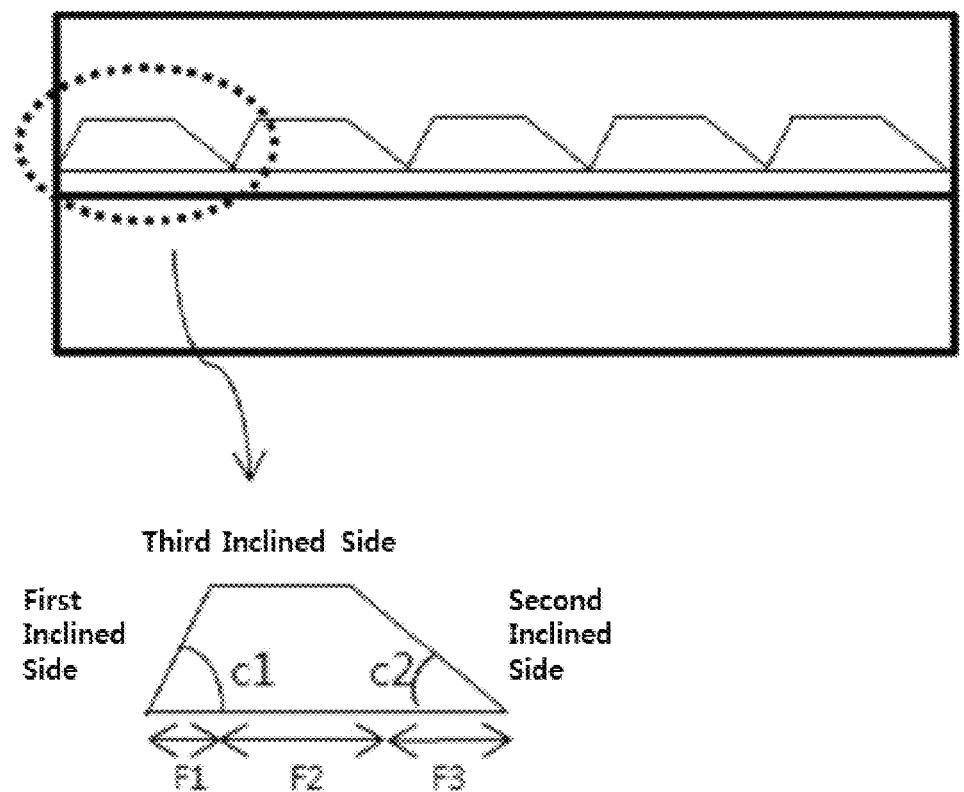

[FIG. 7A]
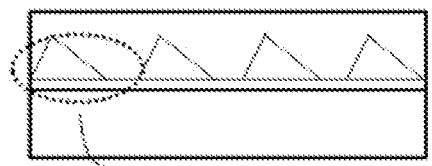
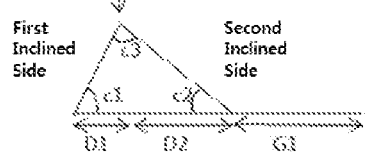
[FIG. 7B]
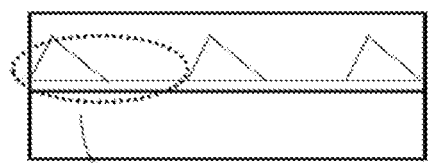
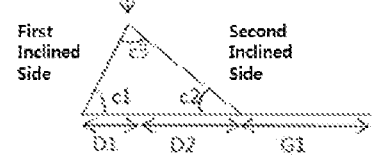
[FIG. 8]
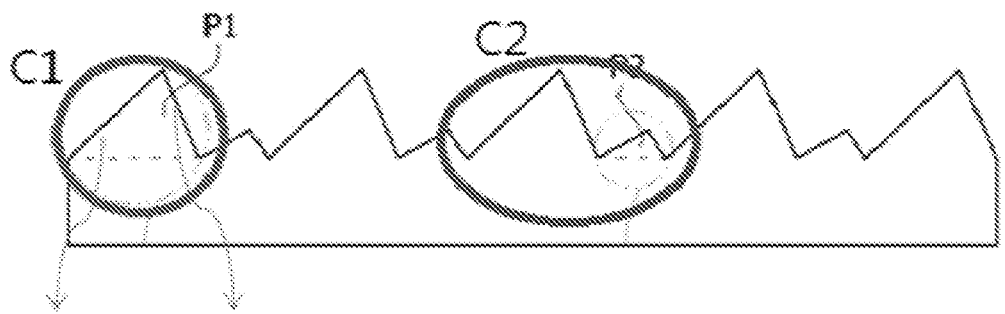
[FIG. 9]
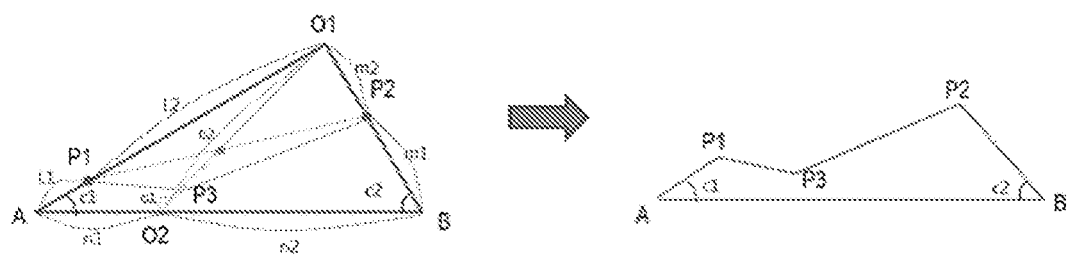

[FIG. 10A]
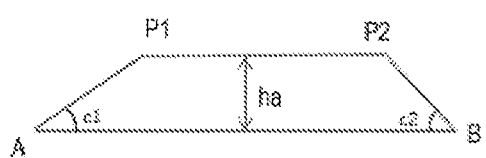
[FIG. 10B]
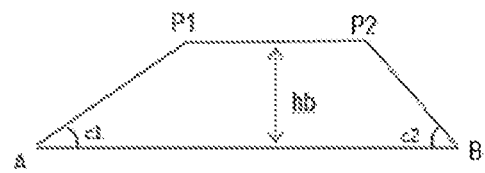
[FIG. 11]
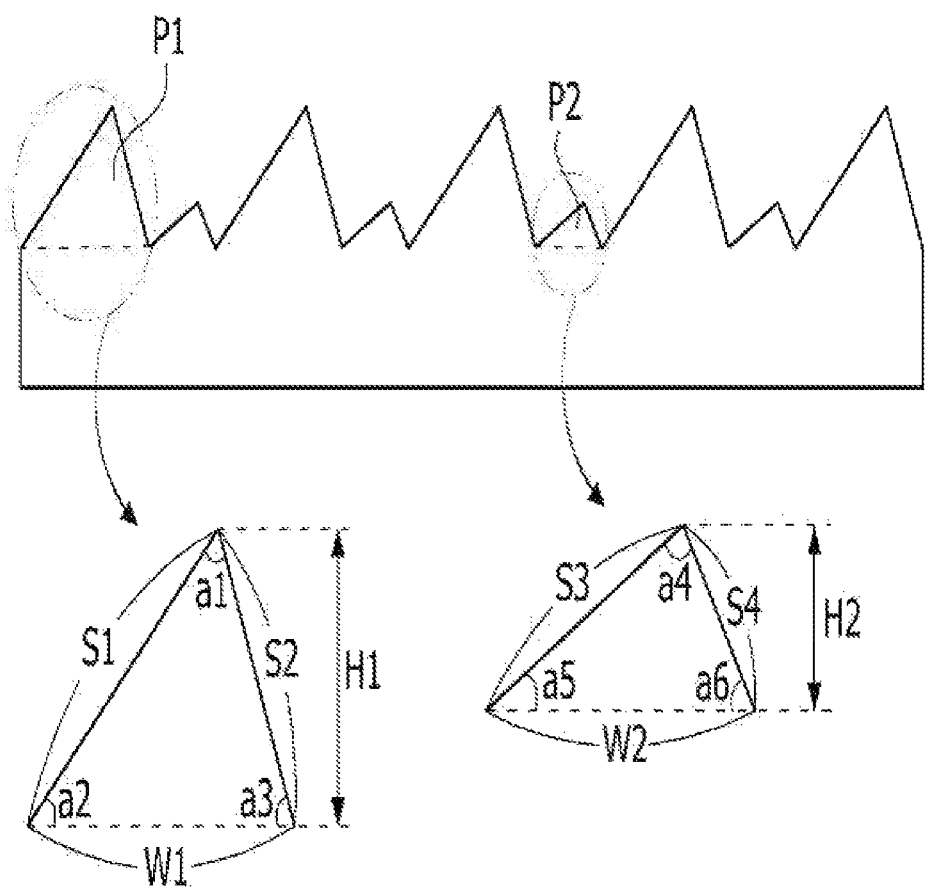

【FIG. 12】
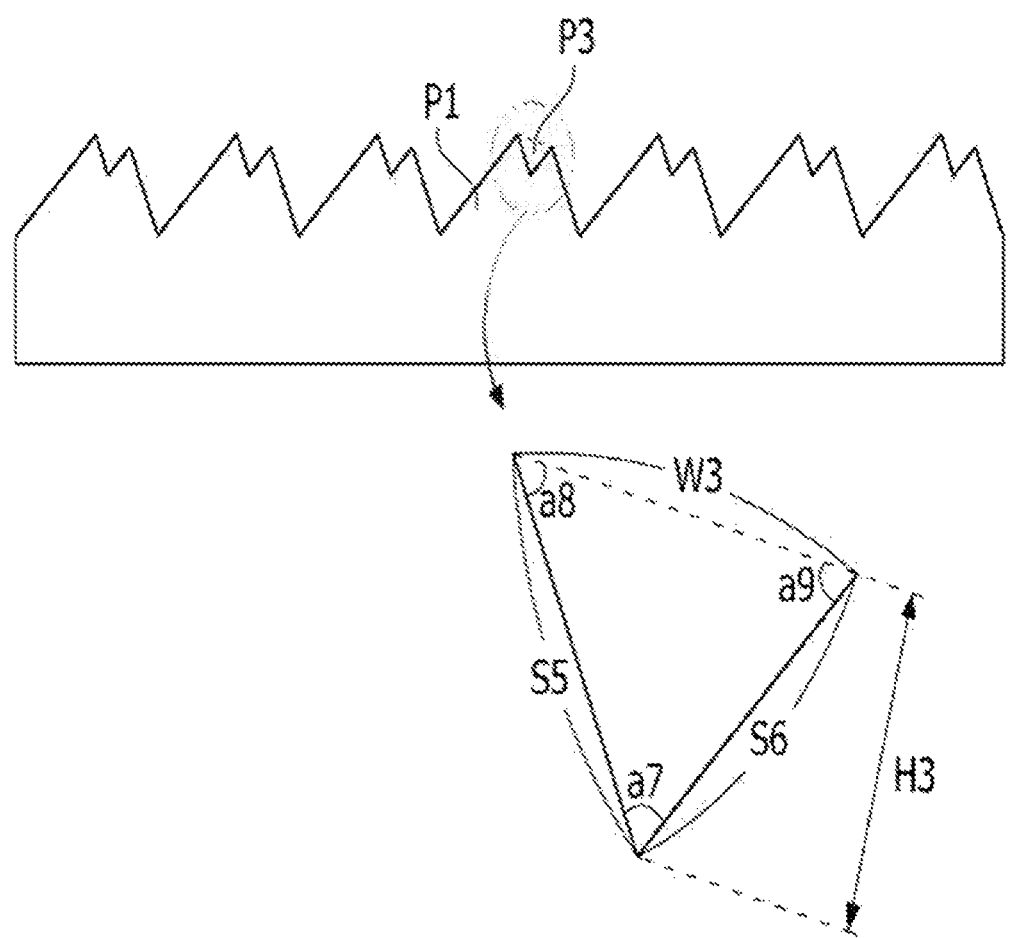

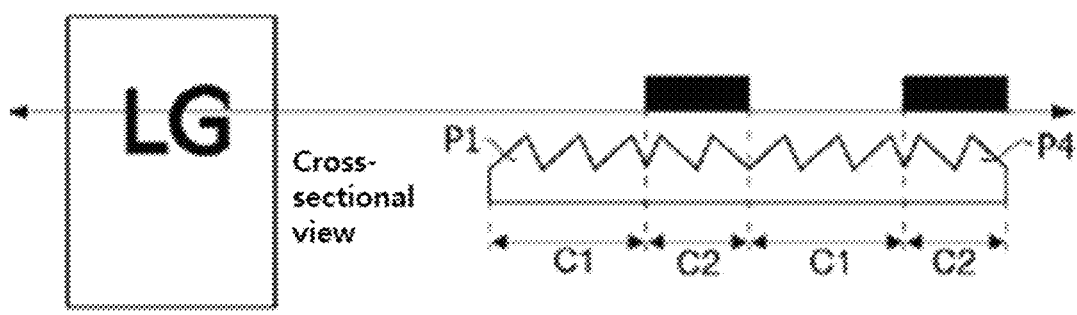
[FIG. 13A]
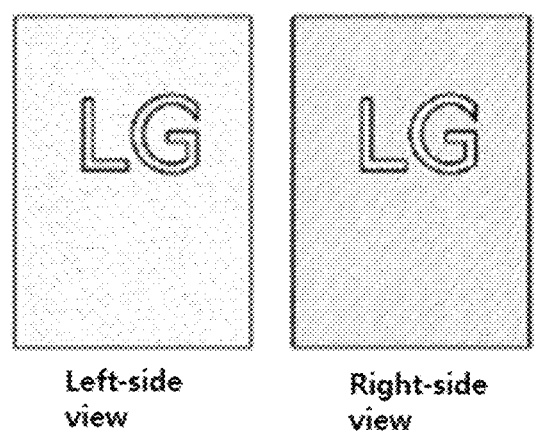
[FIG. 13B]

[FIG. 14]
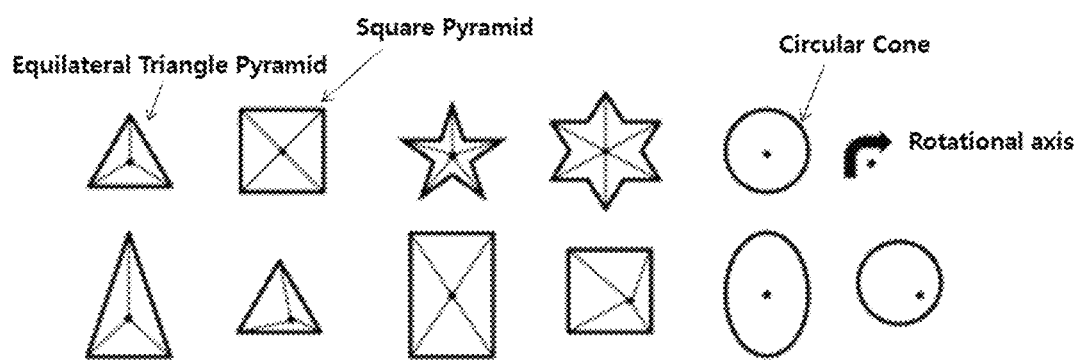
[FIG. 15]
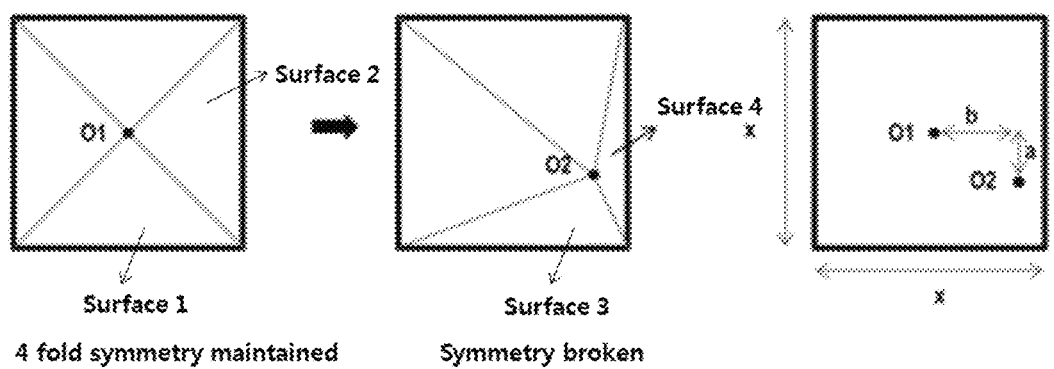

[FIG. 16A]
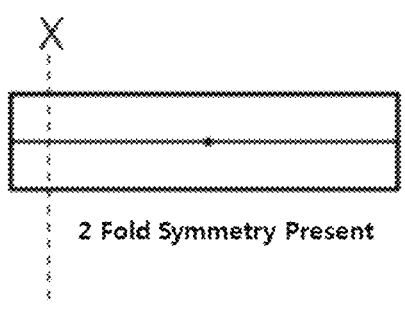
2 Fold Symmetry Present
X-X' cross section
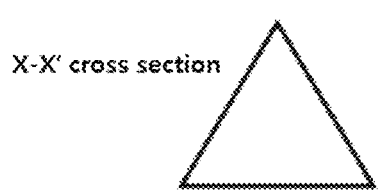
[FIG. 16B]
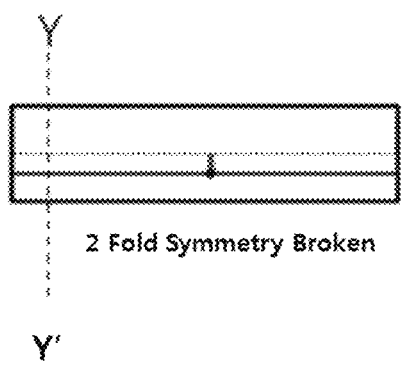
2 Fold Symmetry Broken
Y-Y' cross section
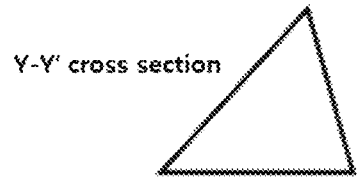
Rotational axis

[FIG. 17]
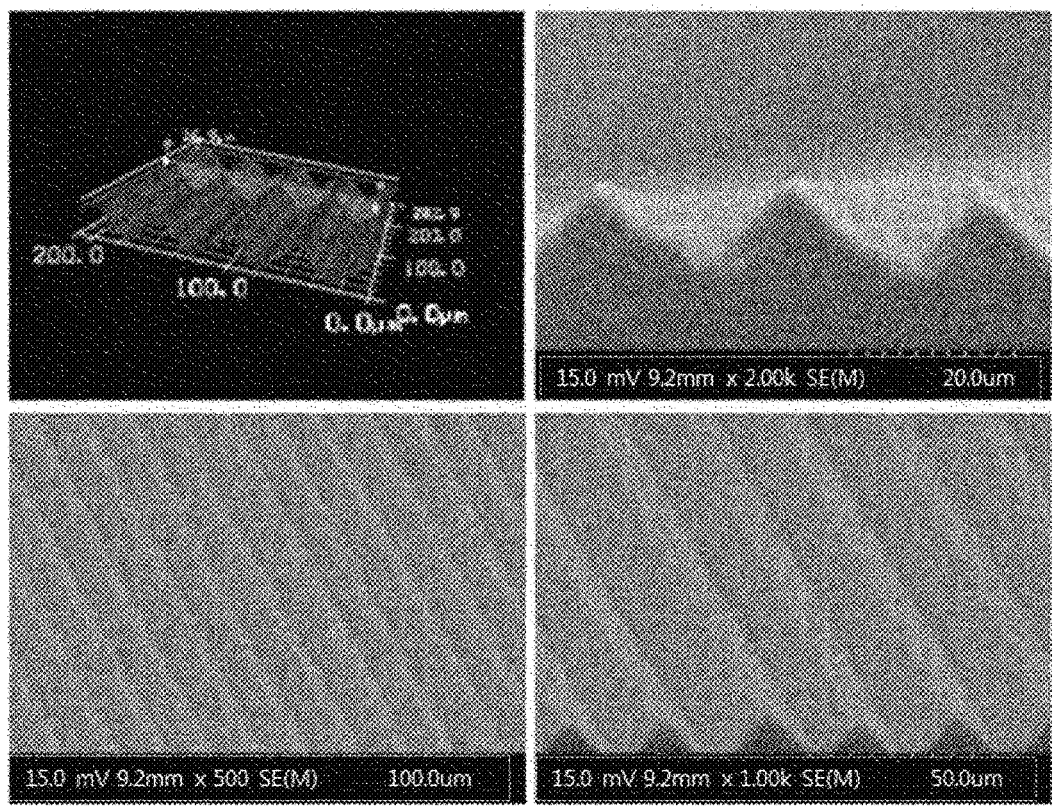
[FIG. 18]
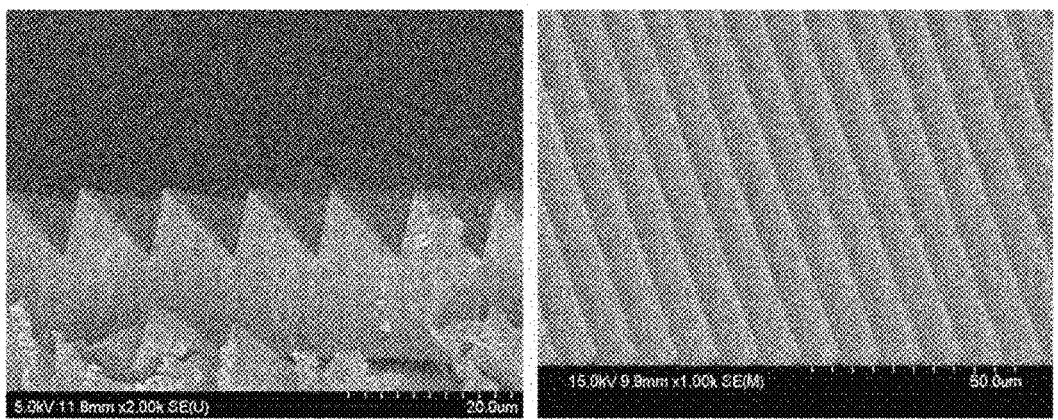

[FIG. 19]
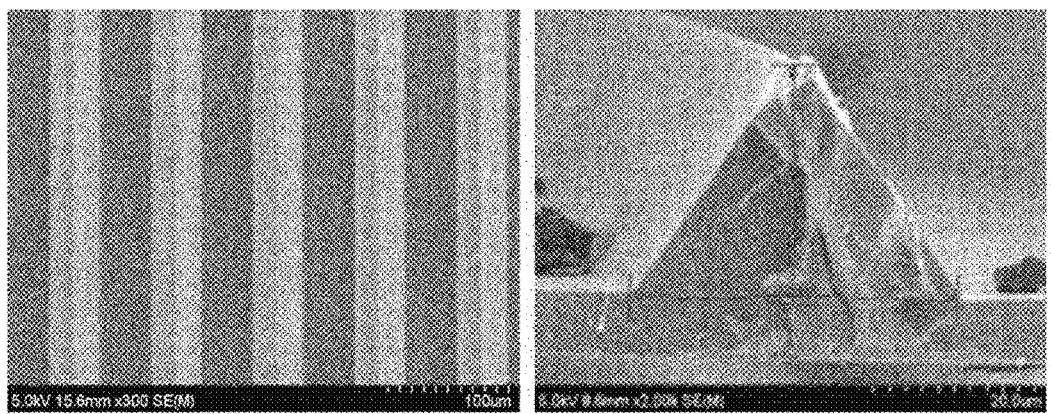
[FIG. 20]
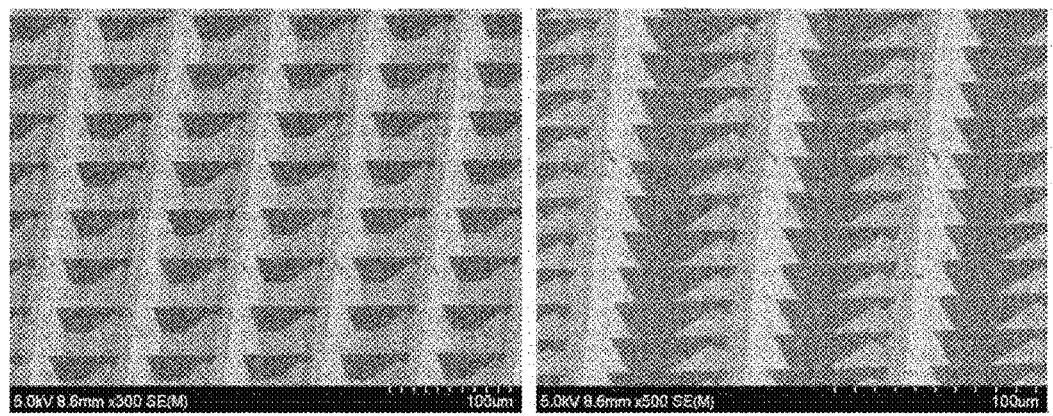

[FIG. 21A] 
[FIG. 21B] 
[FIG. 21C] 
[FIG. 21D] 
[FIG. 21E] 
[FIG. 21F] 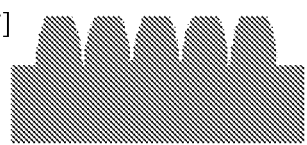
[FIG. 21G] 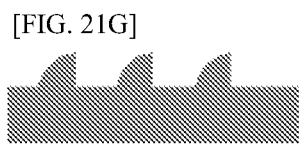
[FIG. 21H] 
[FIG. 21I] 
[FIG. 22]
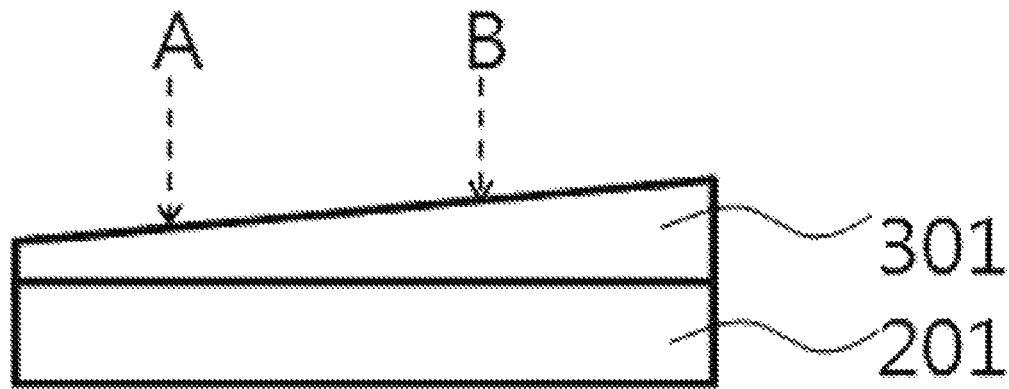

【FIG. 23】
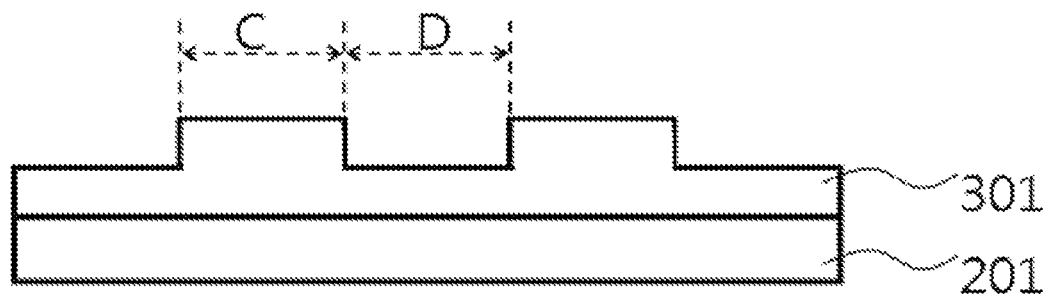
【FIG. 24】
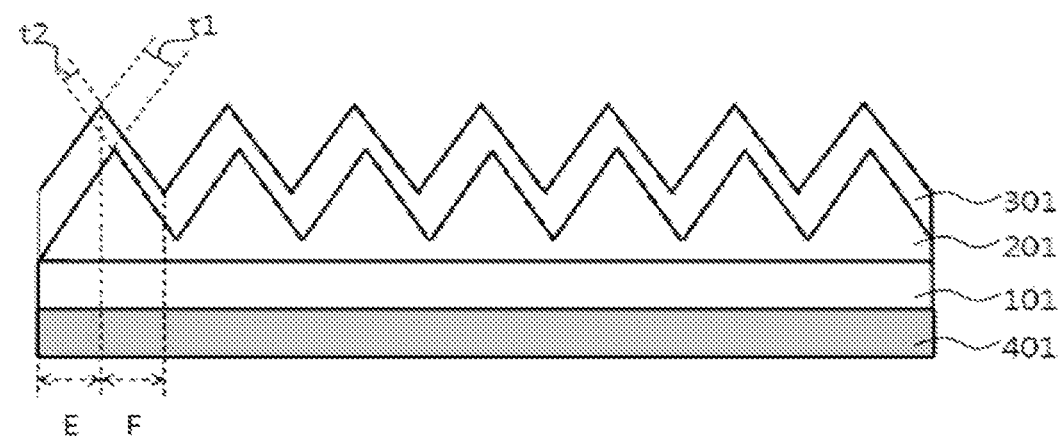
【FIG. 25】
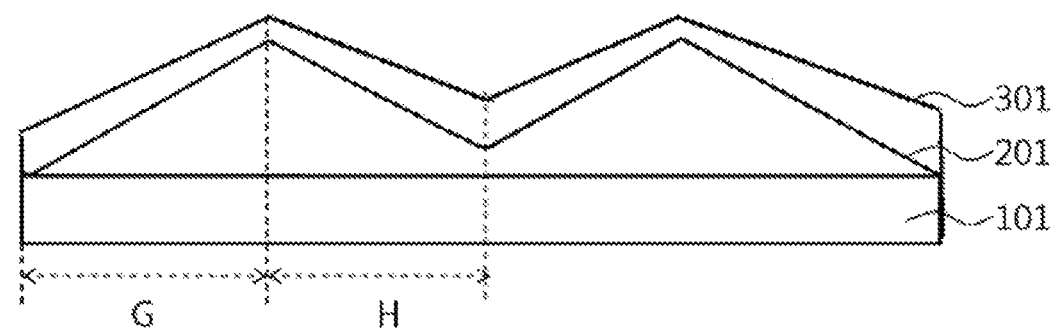

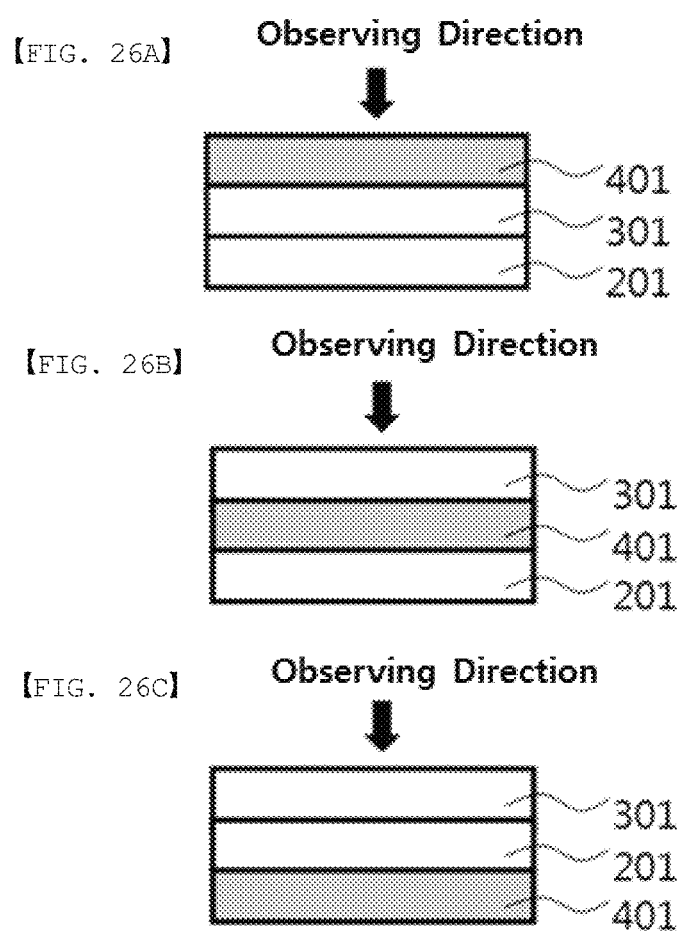

[FIG. 27A] Observing Direction
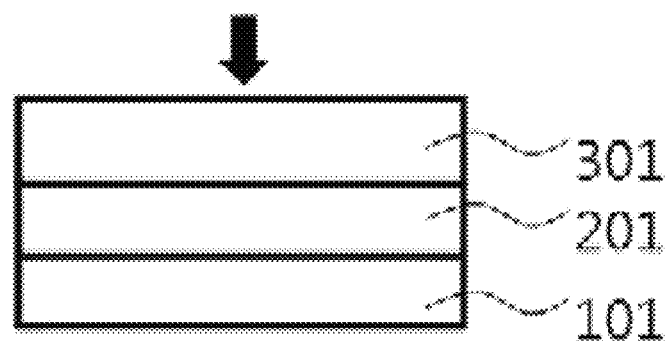
301
201
101
[FIG. 27B] Observing Direction
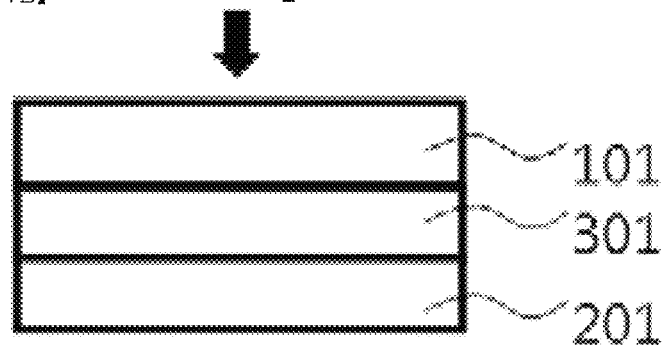
101
301
201

[FIG. 28A]
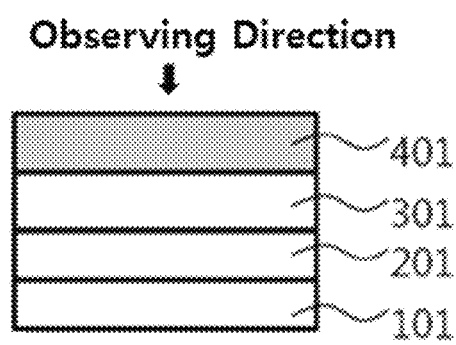
[FIG. 28B]
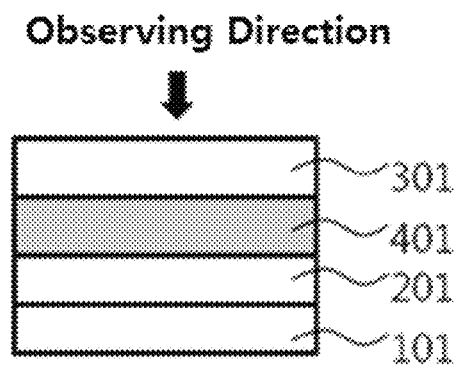
[FIG. 28C]
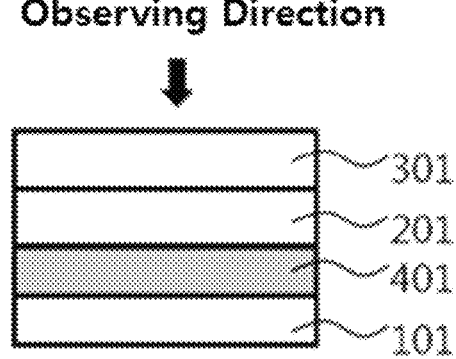
[FIG. 28D]
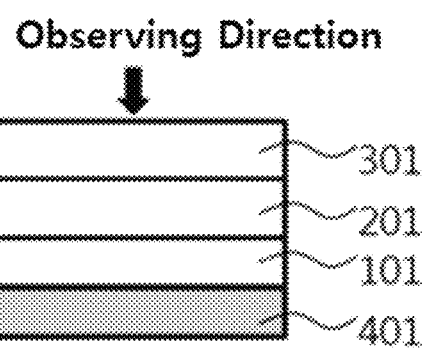
[FIG. 28E]
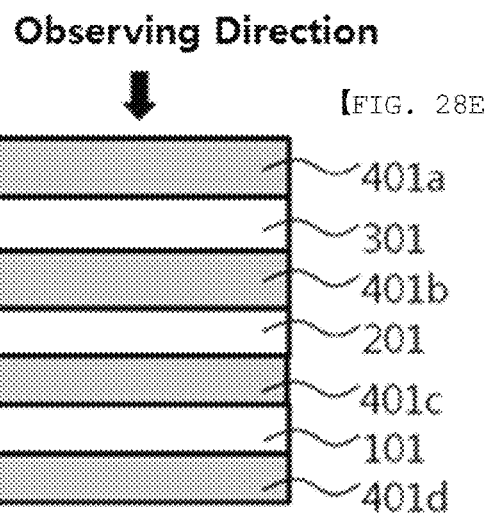

[FIG. 29A]
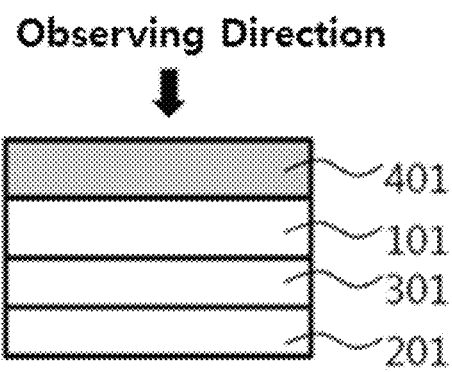
[FIG. 29D]
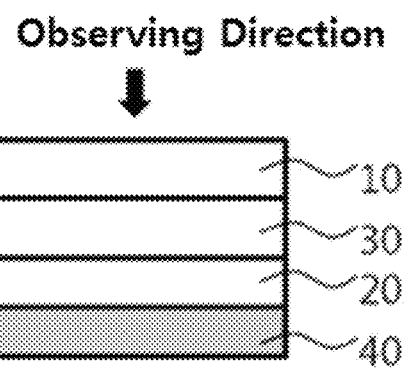
[FIG. 29B]
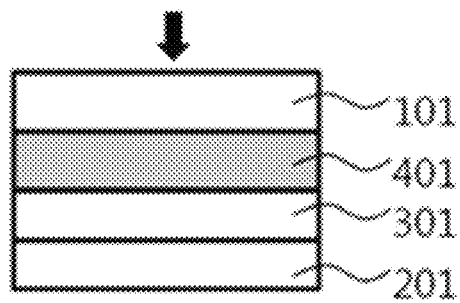
[FIG. 29E]
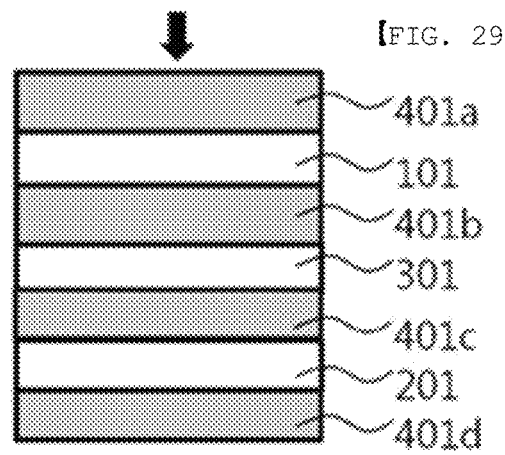
[FIG. 29C]
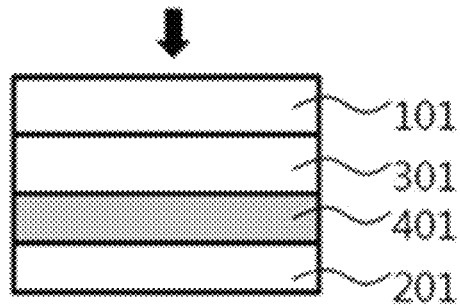

[FIG. 30]
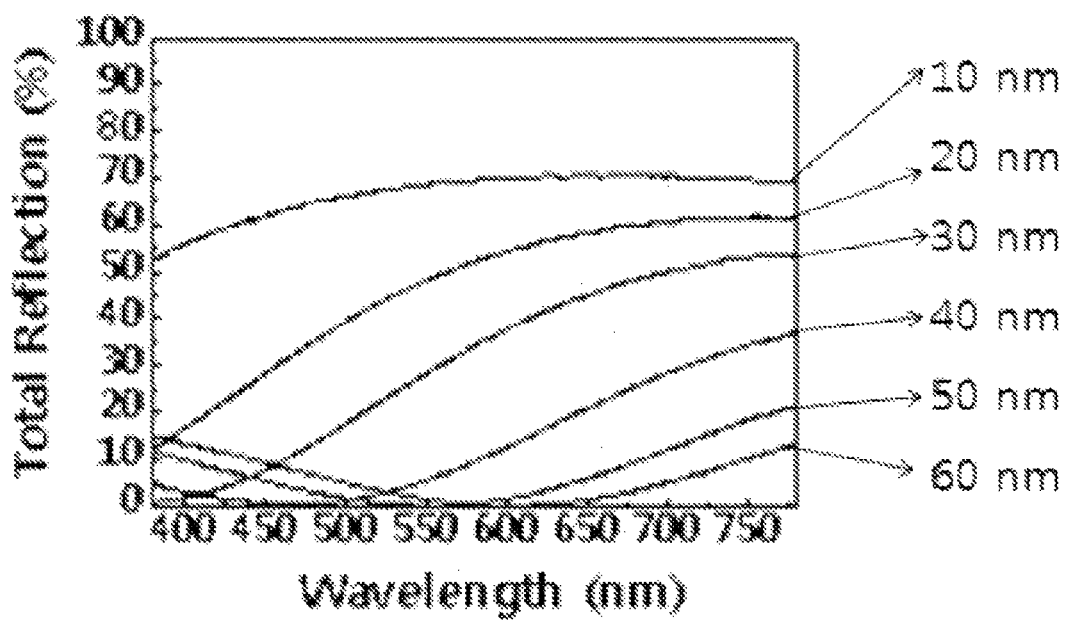

[FIG. 31]
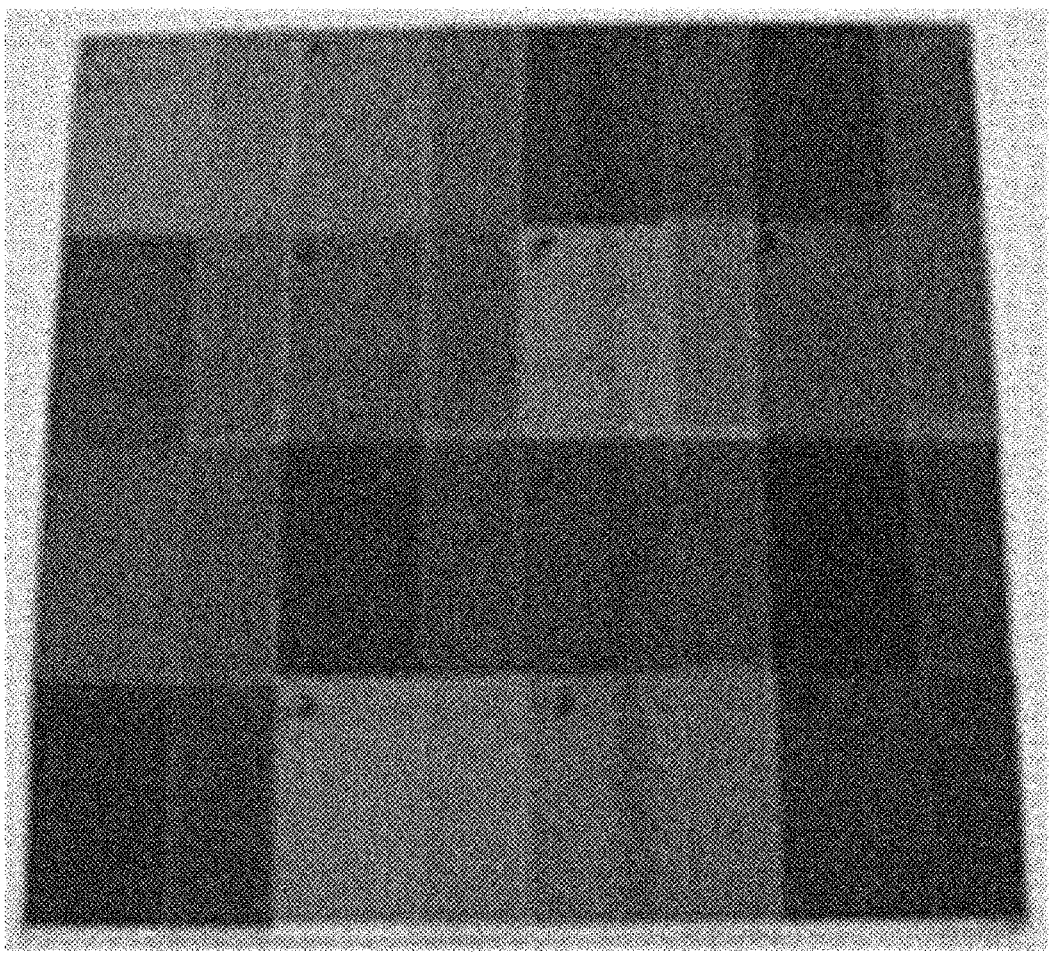

[FIG. 32]
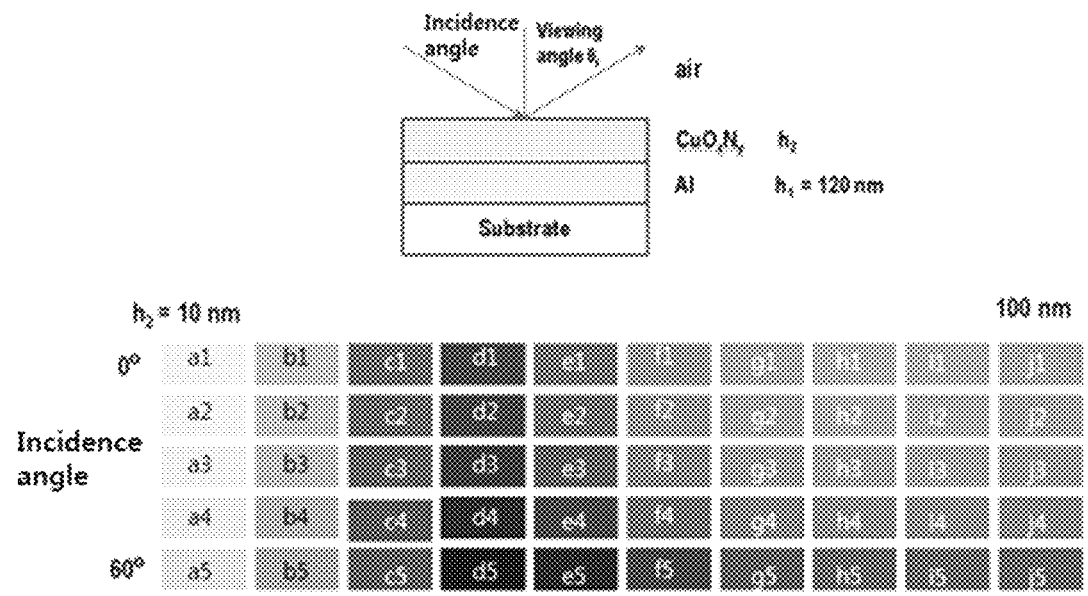
[FIG. 33]
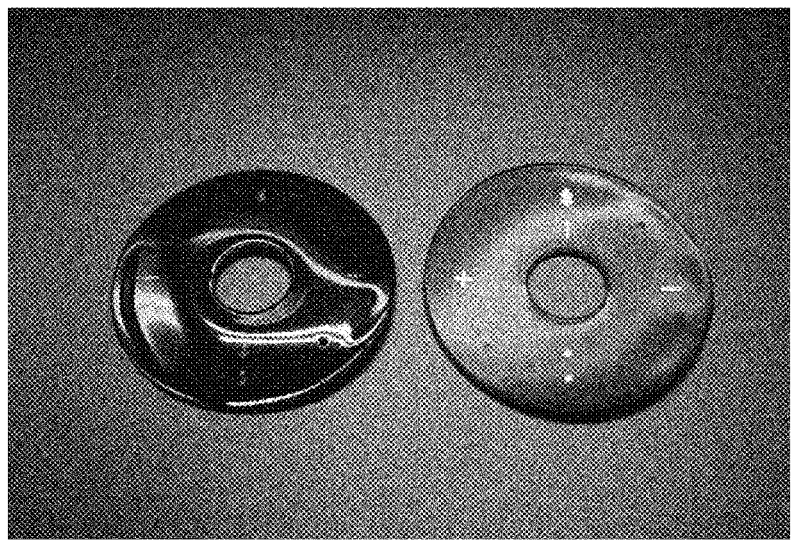

[FIG. 34]
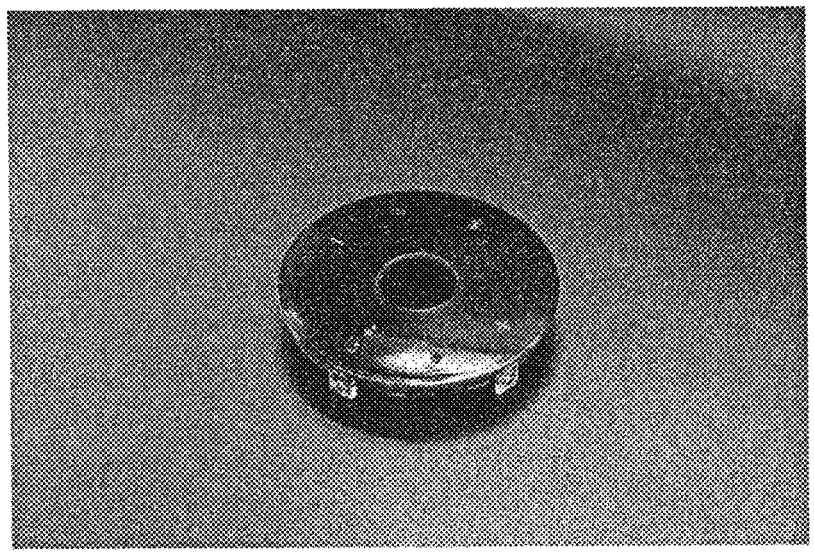
[FIG. 35]
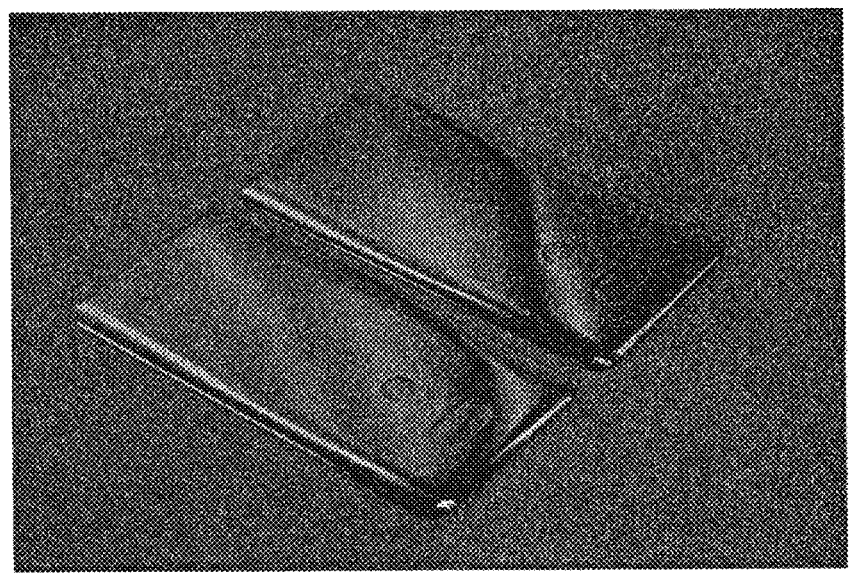

DECORATION MEMBER AND METHOD FOR PRODUCING SAME

CROSS-REFERENCE TO RELATED APPLICATIONS

This application is a U.S. national stage of international Application No. PCT/KR2018/015787, filed Dec. 12, 2018, and claims priority to and the benefits of Korean Patent Application No. 10-2017-0173250, filed with the Korean Intellectual Property Office on Dec. 15, 2017, the entire contents of which are incorporated herein by reference.

TECHNICAL FIELD

The present application relates to a decoration element and a method for preparing the same. In particular, the present application relates to a decoration element suitable for use in mobile devices or electronic products, and a method for preparing the same.

BACKGROUND

For mobile phones, various mobile devices and electronic products, product designs such as colors, shapes and patterns play a major role in providing product value to customers in addition to product functions. Product preferences and prices are also dependent on designs.

For mobile phones, for example, various colors and color senses are obtained using various methods during production. A method of providing colors to a mobile phone case material itself or a method of providing designs by attaching a deco film implementing colors and shapes to a case material may be included.

In existing deco films, attempts have been made to develop colors through methods such as printing and deposition. When expressing heterogeneous colors on a single surface, printing needs to be conducted two or more times, and implementation is hardly realistic when applying various different colors to a three-dimensional pattern. In addition, existing deco films have fixed colors depending on a viewing angle, and even when there is a slight change, the change is limited to just a difference in the color sense.

SUMMARY

The present application is directed to providing a decoration element capable of readily obtaining various colors, capable of obtaining a number of colors on a three-dimensional pattern as necessary, and capable of providing color changes depending on a viewing angle.

One embodiment of the present application provides a decoration element including a color developing layer including a light reflective layer, and a light absorbing layer provided on the light reflective layer and including a convex portion or concave portion shape having an asymmetric-structured cross-section; and an in-mold label layer provided on one surface of the color developing layer.

According to another embodiment of the present application, the color developing layer further includes a color film provided on a surface opposite to the surface facing the light absorbing layer of the light reflective layer, between the light reflective layer and the light absorbing layer, or on a surface opposite to the surface facing the light reflective layer of the light absorbing layer.

According to another embodiment of the present application, the color film employs a color difference $\Delta E^*ab$, a distance in space of $L^*a^*b^*$ in a color coordinate CIE $L^*a^*b^*$ of the color developing layer, to be greater than 1 when the color film is present compared to when the color film is not provided.

According to another embodiment of the present application, a substrate is provided on a surface opposite to the surface facing the light absorbing layer of the light reflective layer, or on a surface opposite to the surface facing the light reflective layer of the light absorbing layer. The substrate may be provided on a surface opposite to the surface facing the light absorbing layer of the light reflective layer, and the color film may be provided between the substrate and the light reflective layer, or on a surface opposite to the surface facing the light reflective layer of the substrate. The substrate may be provided on a surface opposite to the surface facing the light reflective layer of the light absorbing layer, and the color film may be provided between the substrate and the light absorbing layer, or on a surface opposite to the surface facing the light absorbing layer of the substrate.

According to another embodiment of the present application, the light absorbing layer includes two or more points with different thicknesses.

According to another embodiment of the present application, the light absorbing layer includes two or more regions with different thicknesses.

According to another embodiment of the present application, the light absorbing layer includes one or more regions in which an upper surface has an inclined surface with an angle of inclination of greater than 0 degrees and less than or equal to 90 degrees, and the light absorbing layer includes one or more regions having a thickness different from a thickness in any one region having the inclined surface.

According to another embodiment of the present application, the light absorbing layer includes one or more regions with a gradually changing thickness.

According to another embodiment of the present application, the light absorbing layer includes one or more regions in which an upper surface has an inclined surface with an angle of inclination of greater than 0 degrees and less than or equal to 90 degrees, and at least one region having the inclined surface has a structure in which a thickness of the light absorbing layer gradually changes.

According to another embodiment of the present application, the light absorbing layer has an extinction coefficient (k) value of greater than 0 and less than or equal to 4, preferably 0.01 to 4 at 400 nm.

According to another embodiment of the present application, the decoration element is a deco film, a case of a mobile device, a case of an electronic product, or a commodity requiring color decoration.

According to embodiments described in the present specification, light absorption occurs in each of an entering path when external light enters through a color developing layer and in a reflection path when reflected, and since external light is reflected on each of a light absorbing layer surface and a light reflective layer surface, constructive interference and destructive interference phenomena occur between reflected light on the light absorbing layer surface and reflected light on the light reflective layer surface. Specific colors may be developed through such light absorption in the entering path and the reflection path, and the constructive interference and destructive interference phenomena. Accordingly, specific colors may be obtained according to light reflective layer material-dependent reflectance spectra and according to light absorbing layer compositions. In addition, since developed colors are thickness dependent, colors may vary depending on thicknesses even when having the same material composition.

Additionally, when further including a color film, the width of obtainable colors can be further increased much even when materials and thicknesses of the light reflective layer and the light absorbing layer are determined. The width of color changes obtained by the color filter addition may be defined by a color difference (ΔE*ab), a difference in L*a*b* before and after applying the color filter. Furthermore, a plurality of colors can be developed by allowing the light absorbing layer to have two or more points or regions with different thicknesses on the same surface, and by forming a color developing layer on a three-dimensional pattern, various colors can be obtained in the three-dimensional pattern.

In addition, when an upper surface of the light absorbing layer has at least one inclined surface, changes in the developed colors can be obtained depending on a viewing angle, and the light absorbing layer can be prepared to have two or more regions with different thicknesses using a simple process.

In addition, by including an in-mold label layer on one surface of the color developing layer, the decoration element according to one embodiment of the present application is capable of being used as a decoration element such as a deco film or a case of a mobile device.

BRIEF DESCRIPTION OF DRAWINGS

FIG. 1 illustrates a laminated structure of a decoration element according to an exemplary embodiment.

FIG. 2 illustrates the working principle of light reflection and light absorption according to an exemplary embodiment.

FIG. 3 illustrates a light absorbing layer and a light reflective layer of a decoration element according to an exemplary embodiment.

FIGS. 4 to 16B illustrate various inclined surfaces of a light absorbing layer according to exemplary embodiments.

FIGS. 17 to 19 are scanning electron microscopy (SEM) images of a convex portion of a light absorbing layer according to an exemplary embodiment.

FIG. 20 is an SEM image of a decoration element placed on the ground according to an exemplary embodiment.

FIGS. 21A to 21I illustrate various surfaces of convex portion or concave portion shapes according to exemplary embodiments.

FIGS. 22 and 23 illustrate exemplary embodiments of a structure in which a substrate, a light reflective layer and a light absorbing layer are laminated.

FIGS. 24 and 25 illustrate a structure of a decoration element having a light absorbing layer in which an upper surface has an inclined surface according to an exemplary embodiment.

FIGS. 26A to 29E illustrate a laminated structure of a decoration element according to exemplary embodiments of the present.

FIG. 30 is a reflectance simulation graph of CuO deposition thickness according to an exemplary embodiment.

FIG. 31 is an image showing the colors obtained from reflectance of light of the light absorbing layer according to an exemplary embodiment.

FIG. 32 shows the development of various colors depending on a thickness of a light absorbing layer according to an exemplary embodiment.

FIGS. 33 and 34 are photographs of a product manufactured through an in-mold labeling process according to one embodiment of the present application.

FIG. 35 is a photograph of a product manufactured through a glass laminating process.

REFERENCE NUMERALS USED HEREIN

100: Color Developing Layer
101: Substrate
201: Light Reflective Layer
301: Light Absorbing Layer
401, 401a, 401b, 401c, 401d: Color Film
1101: In-Mold Label Layer

DETAILED DESCRIPTION

Hereinafter, the present disclosure will be described in detail.

In the present specification, a "point" means one position that does not have an area. In the present specification, the expression is used to indicate that a light absorbing layer has two or more points with different thicknesses.

In the present specification, a "region" represents a part having a certain area. For example, when placing the decoration element on the ground so that a light reflective layer is placed at the bottom and the light absorbing layer is placed at the top and dividing both ends of the inclined surface or both ends with the same thickness perpendicular with respect to the ground, the region having an inclined surface means an area divided by the both ends of the inclined surface, and the region with the same thickness means an area divided by the both ends with the same thickness.

In the present specification, a "surface" or "region" may be a flat surface, but is not limited thereto, and a part or all may be a curved surface. For example, structures in which a vertical cross-section shape is a part of an arc of a circle or oval, a wave structure, a zigzag or the like may be included.

In the present specification, an "inclined surface" means, when placing the decoration member on the ground so that a light reflective layer is placed at the bottom and the light absorbing layer is placed at the top, a surface having an angle formed by the upper surface with respect to the ground of greater than 0 degrees and less than or equal to 90 degrees.

In the present specification, a "thickness" of a certain layer means a shortest distance from a lower surface to an upper surface of the corresponding layer.

In the present specification, "or" represents, unless defined otherwise, a case of selectively or all including those listed, that is, a meaning of "and/or".

In the present specification, a "layer" means covering 70% or more of an area where the corresponding layer is present. It means covering preferably 75% or more, and more preferably 80% or more.

One embodiment of the present application provides a decoration element including a color developing layer including a light reflective layer, and a light absorbing layer provided on the light reflective layer and including a convex portion or concave portion shape having an asymmetric-structured cross-section; and an in-mold label layer provided on one surface of the color developing layer.

In the present specification, resistance or surface resistance may be measured in accordance with a 4-point probe method using a known surface resistor. As for the surface resistance, a resistance value (V/I) is measured by measuring a current (I) and voltage (V) using 4 probes, and by using an area (unit area, W) of a sample and a distance (L) between electrodes for measuring resistance, surface resistance is obtained (V/I×W/L), and then, a resistive corrector factor (RCF) is multiplied thereby to calculate as ohm/square, a surface resistance unit. The resistive corrector factor may be calculated using a sample size, a sample thickness and a temperature at the time of measurement, and may be calculated using the Poisson's equation. Surface resistance of the whole laminate may be measured and calculated from the laminate itself, and surface resistance of each layer may be measured before forming layers formed with remaining materials other than a target layer to measure from the whole laminate, may be measured after removing layers formed with remaining materials other than a target layer to measure from the whole laminate, or may be measured by analyzing materials of a target layer and then forming a layer under the same condition as the target layer.

In one embodiment of the present specification, materials known in the art may be used as the substrate. Specifically, glass, plastic or the like may be used as the substrate, however, the substrate is not limited thereto.

In one embodiment of the present specification, a transparent substrate may be used as the substrate. In one embodiment, those having transmittance of 60% or higher in a visible region may be used as the substrate. In another embodiment, those having transmittance of 80% or higher in a visible region may be used as the substrate.

In one embodiment of the present specification, glass having transmittance of 80% or higher may be used as the substrate. The substrate thickness may be selected as necessary, and for example, may be in a range of 50 μm to 200 μm.

FIG. 1 illustrates a laminated structure of a decoration element according to an exemplary embodiment of the present application. The decoration element of FIG. 1 includes a color developing layer (100) and an in-mold label layer (1101). The color developing layer (100) includes a substrate (101), a light reflective layer (201) and a light absorbing layer (301). FIG. 1 illustrates a structure in which the substrate (101) is provided on the light reflective layer (201) side of the color developing layer (100), however, the substrate (101) may not be included, or may be provided on a surface opposite to the surface adjoining the light absorbing layer (201) of the light reflective layer (301).

According to the exemplary embodiments, light absorption occurs along an incident path and a reflection path of light in the light absorbing layer, and by the light reflecting on each of a surface of the light absorbing layer and an interface of the light absorbing layer and the light reflective layer, the two reflected lights go through constructive or destructive interference. In the present specification, the light reflected on the surface of the light absorbing layer may be expressed as surface reflected light, and the light reflected on the interface of the light absorbing layer and the light reflective layer may be expressed as interface reflected light. A mimetic diagram of such a working principle is illustrated in FIG. 2. FIG. 2 illustrates a structure in which a substrate (101) is provided on a light reflective layer (201) side, however, the structure is not limited to such a structure, and the substrate (101) may be disposed on other locations as described above.

The light absorbing layer and the light reflective layer are described are illustrated in FIG. 3. In the decoration element of FIG. 3, the layers are laminated in order of a $L_{i-1}$ layer, a $L_i$ layer and a $L_{i+1}$ layer based on a light entering direction.

An interface $I_i$ is located between the layer and the $L_i$ layer, and an interface $I_{i+1}$ is located between the $L_i$ layer and the $L_{i-1}$ layer.

When light having a specific wavelength is irradiated in a direction perpendicular to each layer so that thin film interference does not occur, reflectance at the interface $I_i$ may be expressed by the following Mathematical Relation 1:

$$\frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2}. \quad \text{[Mathematical Relation 1]}$$

In Mathematical Relation 1, $n_i(\lambda)$ means a refractive index depending on the wavelength ($\lambda$) of the ith layer, and $k_i(\lambda)$ means an extinction coefficient depending on the wavelength ($\lambda$) of the ith layer. The extinction coefficient is a measure of how strongly a subject material absorbs light at a specific wavelength, and is defined later herein.

Using Mathematical Relation 1, $R_i$, which is a sum of reflectance for each wavelength at the interface $I_i$ calculated at each wavelength, and is calculated as in the following Mathematical Equation 2:

$$R_i = \frac{\sum_{\lambda=380nm}^{\lambda=780nm} \frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380nm}^{\lambda=780nm} \Delta\lambda}. \quad \text{[Mathematical Equation 2]}$$

According to exemplary another embodiment of the present application, when the light absorbing layer includes a pattern, the pattern may have a symmetric structure, an asymmetric structure or a combination thereof.

According to an exemplary embodiment, the light absorbing layer may further include a symmetric-structured pattern. As the symmetric structure, a prism structure, a lenticular lens structure and the like are included.

According to another exemplary embodiment of the present application, the light absorbing layer may include an asymmetric-structured pattern.

In an exemplary embodiment of the present specification, the light absorbing layer includes a convex portion or concave portion shape having an asymmetric-structured cross-section.

In an exemplary embodiment of the present specification, the light absorbing layer includes a convex portion shape having an asymmetric-structured cross-section.

In an exemplary embodiment of the present specification, the light absorbing layer includes a concave portion shape having an asymmetric-structured cross-section.

In an exemplary embodiment of the present specification, the light absorbing layer includes a convex portion shape having an asymmetric-structured cross-section and a concave portion shape having an asymmetric-structured cross-section.

In the present specification, the "cross-section" means a surface when cutting the convex portion or concave portion in any one direction. For example, the cross-section may mean, when placing the decoration member on the ground, a surface when cutting the convex portion or concave portion in a direction parallel to the ground or a direction perpendicular to the ground. In the surface of the convex portion or concave portion shape of the light absorbing layer of the decoration member according to the exemplary embodiment, at least one of the cross-sections in a direction perpendicular to the ground has an asymmetric structure.

In the present specification, the "asymmetric-structured cross-section" means a structure in which the cross-section of a figure formed with borders does not have line symmetry or point symmetry. Line symmetry refers to overlapping of figures when mirroring with respect to a central straight line. Point symmetry refers to, having a symmetrical property completely overlapping the original figure when the original figure is rotated 180 degrees around one point. Herein, the borders of the asymmetric-structured cross-section may be a straight line, a curved line or a combination thereof.

In an exemplary embodiment of the present specification, in the convex portion or concave portion shape having an asymmetric-structured cross-section, at least one cross-section includes two or more sides having different angle of inclinations, different curvatures, or different side shapes. For example, when two sides among the sides forming at least one cross-section have different angle of inclinations, different curvatures, or different side shapes, the convex portion or concave portion has an asymmetric structure.

As described above, the decoration member may develop dichroism by the convex portion or concave portion having an asymmetric-structured cross-section included in the surface of the light absorbing layer. Dichroism means different colors being observed depending on a viewing angle. Colors may be expressed by CIE L*a*b*, and a color difference may be defined using a distance ($\Delta E^*ab$) in the L*a*b* space. Specifically, the color difference is $$\Delta E \cdot ab = \sqrt{(\Delta L)^2 + (\Delta a)^2 + (\Delta b)^2},$$

and within a range of $0<\Delta E^*ab<1$, an observer may not recognize the color difference [See e.g., Machine Graphics and Vision 20(4):383-411 (2011)]. Accordingly, dichroism may be defined by $\Delta E^*ab>1$ in the present specification.

In an exemplary embodiment of the present specification, the decoration element has dichroism of $\Delta E^*ab>1$. Specifically, a color difference $\Delta E^*ab$, a distance in L*a*b* space in a color coordinate CIE L*a*b* of the whole decoration element, may be greater than 1.

In an exemplary embodiment of the present specification, the color developing layer has dichroism of $\Delta E^*ab>1$. Specifically, a color difference $\Delta E^*ab$, a distance in L*a*b* space in a color coordinate CIE L*a*b* of the color developing layer, may be greater than 1.

In an exemplary embodiment of the present specification, the shape of the convex portion or concave portion includes a first inclined surface and a second inclined surface having different angle of inclinations.

In an exemplary embodiment of the present specification, in the shape of the convex portion or concave portion, at least one cross-section includes a first inclined side and a second inclined side having different angle of inclinations. Shapes of the first inclined side and the second inclined side are the same as or different from each other, and are each a straight-line shape or a curved-line shape.

In an exemplary embodiment of the present specification, the borders of the asymmetric-structured cross-section are a straight line, a curved line or a combination thereof.

FIG. 4 illustrates the first inclined side and the second inclined side having a straight-line shape. Each convex portion shape includes a first area (D1) including a first inclined side and a second area (D2) including a second inclined side. The first inclined side and the second inclined side have a straight-line shape. An angle (c3) formed by the first inclined side and the second inclined side may be from 75 degrees to 105 degrees. An angle (c1) formed by the first inclined side and the ground (substrate) and an angle (C2) formed by the second inclined side and the ground are different. For example, a combination of c1 and c2 may be 20 degrees/80 degrees, 10 degrees/70 degrees or 30 degrees/70 degrees.

FIGS. 5A and 5B illustrate the first inclined side or the second inclined side having a curved-line shape. The cross-section of the light absorbing layer has a convex portion shape, and the cross-section of the convex portion shape includes a first area (E1) including a first inclined side and a second area (E2) including a second inclined side. Any one or more of the first inclined side and the second inclined side may have a curved-line shape. For example, the first inclined side and the second inclined side may both have a curved-line shape, or the first inclined side may have a straight-line shape, and the second inclined side may have a curved-line shape. When the first inclined side has a straight-line shape and the second inclined side has a curved-line shape, the angle c1 may be larger than the angle c2. FIGS. 5A and 5B illustrate the first inclined side having a straight-line shape and the second inclined side having a curved-line shape. The angle formed by the inclined side having a curved-line shape with the ground may be calculated from an angle formed by the straight line and the ground when drawing an arbitrary straight line from a point where the inclined side touching the ground to a point where the first inclined side adjoins the second inclined side. The second inclined side have a curved-line shape may have a different curvature depending on the light absorbing layer height, and the curved line may have a radius of curvature. The radius of curvature may be 10 times or less than the width (E1+E2) of the convex portion shape. FIG. 5A illustrates an exemplary embodiment where the curved line has a radius of curvature that is twice the width of the convex portion shape, and FIG. 5B illustrates an exemplary embodiment where the curved line has a radius of curvature that is the same as the width of the convex portion shape. A ratio of the part (E2) having a curvature with respect to the width (E1+E2) of the convex portion may be 90% or less. As illustrated in FIGS. 5A and 5B, a ratio of the part (E2) having a curvature with respect to the width (E1+E2) of the convex portion is 60%.

In the present specification, the angle of inclination of the inclined side may be treated the same as the angle of inclination of the inclined surface.

In the present specification, unless mentioned otherwise, the "side" may be a straight line, but is not limited thereto, and a part or all of the "side" may be a curved line. For example, the side may include a structure that is a part of an arc of a circle or oval, a wave structure or a zigzag.

In the present specification, when the side includes a part of an arc of a circle or oval, the circle or oval may have a radius of curvature. The radius of curvature may be defined by the radius of the curve when converting an extremely short section of a curved line into an arc.

In the present specification, the angle of inclination of the convex portion may mean an angle formed by an inclined surface of the convex portion and a horizontal surface of the light absorbing layer. Unless particularly mentioned otherwise in the present specification, the first inclined surface may be defined as a left inclined surface of the convex portion, and the second inclined surface may mean a right inclined surface of the convex portion in the drawings.

In the present specification, unless mentioned otherwise, the "inclined side" means a side having an angle formed by a side with respect to the ground being greater than 0 degrees and less than or equal to 90 degrees when the decoration member is placed on the ground (substrate). Herein, when the side is a straight line, an angle formed by the straight line and the ground may be measured. When the side includes a curved line, an angle formed by the ground and a straight line along the shortest distance connecting a point of the side closest to the ground and a point of the side farthest from the ground when the decoration member is placed on the ground (substrate) may be measured.

In the present specification, unless mentioned otherwise, the "inclined surface" means a surface having an angle formed by a surface with respect to the ground being greater than 0 degrees and less than or equal to 90 degrees when the decoration member is placed on the ground. Herein, when the surface is a flat surface, an angle formed by the flat surface and the ground may be measured. When the surface includes a curved surface, an angle formed by the ground and a straight line along the shortest distance connecting a point of the surface closest to the ground and a point of the surface farthest from the ground in a shortest distance when the decoration member is placed on the ground may be measured.

In the present specification, unless mentioned otherwise, the "angle of inclination" is an angle formed by the ground and a surface or side forming the light absorbing layer, and is greater than 0 degrees and less than or equal to 90 degrees when the decoration member is placed on the ground (substrate). Alternatively, it may mean an angle formed by the ground and a segment (a'-b') made when connecting a point (a') where a surface or side forming the light absorbing layer adjoins the ground and a point (b') where a surface or side forming the light absorbing layer is farthest from the ground.

In the present specification, unless mentioned otherwise, the "curvature" means a degree of changes in the slope of the tangent at continuous points of a side or surface. As the change in the slope of the tangent at continuous points of a side or surface is larger, the curvature is high.

In the present specification, the convex portion may be a convex portion unit shape, and the concave portion may be a concave portion unit shape. The convex portion unit shape or the concave portion unit shape means a shape including two inclined sides (a first inclined side and a second inclined side), and is not a shape including three or more inclined sides. As illustrated in FIG. 8, the convex portion (P1) of the circle C1 is one convex portion unit shape including a first inclined side and a second inclined side. However, the shape included in the circle C2 includes two convex portion unit shapes. The first inclined side may mean a left inclined side of the convex portion or concave portion, and the second inclined side may mean a right inclined side of the convex portion or concave portion.

In an exemplary embodiment of the present specification, an angle formed by the first inclined surface and the second inclined surface may be in a range of 80 degrees to 100 degrees. Specifically, the angle may be 80 degrees or greater, 83 degrees or greater, 86 degrees or greater or 89 degrees or greater, and may be 100 degrees or less, 97 degrees or less, 94 degrees or less or 91 degrees or less. The angle may mean an angle of a vertex formed by the first inclined surface and the second inclined surface. When the first inclined surface and the second inclined surface do not form a vertex with each other, the angle may mean an angle of a vertex formed by virtually extending the first inclined surface and the second inclined surface.

In an embodiment of the present specification, a difference between the angle of inclination of the first inclined surface and the angle of inclination of the second inclined surface may be in a range of 30 degrees to 70 degrees in the convex portion. The difference between the angle of inclination of the first inclined surface and the angle of inclination of the second inclined surface may be, for example, 30 degrees or greater, 35 degrees or greater, 40 degrees or greater or 45 degrees or greater, and may be 70 degrees or less, 65 degrees or less, 60 degrees or less or 55 degrees or less. Having the difference between the angle of inclinations of the first inclined surface and the second inclined surface in the above-mentioned range may be advantageous in terms of obtaining direction-dependent color expression. In other words, when a difference in the angle of inclination of the inclined side is in the above-mentioned range, thicknesses of each of the light absorbing layers formed on the first inclined side and the second inclined side may be different, and as a result, dichroism may be greater when looking at the decoration element from the same direction (refer to the following Table 1).

TABLE 1

| Difference in Angle of inclination of First Inclined Side and Second Inclined Side | Side of First Inclined Side | | | Side of Second Inclined Side | | | ΔE * ab |
|---|---|---|---|---|---|---|---|
| | $L_1$* | $a_1$* | $b_1$* | $L_2$* | $a_2$* | $b_2$* | |
| 0 | 25.6 | 1.2 | −1.3 | 23.8 | 1.4 | −1.8 | 1.9 |
| 10 | 25.6 | 1.2 | −1.3 | 24.0 | 1.4 | −2.6 | 2.1 |
| 20 | 25.6 | 1.2 | −1.3 | 24.9 | 0.8 | −2.4 | 1.4 |
| 30 | 34.6 | 1.1 | −5.7 | 23.8 | 1.1 | −1.1 | 11.7 |
| 40 | 34.0 | 1.1 | −5.7 | 23.8 | 1.1 | −1.1 | 11.2 |
| 50 | 38.1 | 0.8 | −6.3 | 24.0 | 1.1 | −1.1 | 15.0 |
| 60 | 39.2 | 1.2 | −6.9 | 23.8 | 1.1 | −1.1 | 16.5 |

In an embodiment of the present specification, the cross-section of the convex portion or concave portion shape may be a polygonal shape of triangle or square. As illustrated in FIG. 6, the convex portion shape may be a square shape. The square shape may be a general shape having four sides, and is not particularly limited as long as an angle of inclination of each inclined side is different. The square shape may be a shape left after partially cutting a triangle. For example, a trapezoid in which one pair of opposite sides is parallel, or a square shape in which a pair of opposite sides parallel to each other is not present may be included. The convex portion shape includes a first area (F1) including a first inclined side, a second area (F2) including a second inclined side and a third area (F3) including a third inclined side. The third inclined side may or may not be parallel to the ground. For example, when the square shape is a trapezoid, the third inclined side is parallel to the ground. Any one or more of the first inclined side to the third inclined side may have a curved-line shape, as described above. The combined length of F1+F2+F3 may be defined as a pitch of the convex portion shape.

FIG. 9 illustrates a method of determining the shape of the convex portion shape. For example, the convex portion shape may have a shape removing a specific area of the ABO1 triangle shape. A method of determining the removed specific area is as follows. Angle of inclinations c1 and c2 are the same as described above.

1) An arbitrary point P1 on an AO1 segment dividing the AO1 segment in a ratio of L1:L2 is set.

2) An arbitrary point P2 on a BO1 segment dividing the BO1 segment in a ratio of m1:m2 is set.

3) An arbitrary point O2 on an AB segment dividing the AB segment in a ratio of n1:n2 is set.

4) An arbitrary point P3 on an O1O2 segment dividing the O2O1 segment in a ratio of o1:o2 is set.

Herein, the ratios of L1:L2, m1:m2, n1:n2 and o1:o2 are the same as or different from each other, and may be each independently from 1:1000 to 1000:1.

5) The area formed by the P1O1P2P3 polygon is removed.

6) The shape formed by the ABP2P3P1 polygon is employed as the cross-section of the convex portion.

The convex portion shape may be modified to various forms by adjusting the ratios of L1:L2, m1:m2, n1:n2 and o1:o2. For example, the height of the pattern may increase when L1 and m1 increase, and the height of the concave portion formed on the convex portion may decrease when o1 increases, and by adjusting the ratio of n1, the position of the lowest point of the concave portion formed on the convex portion may be adjusted to be closer to any one side of the inclined sides of the convex portion.

When the ratios of L1:L2, m1:m2 and o1:o2 are all the same, the cross-section shape may be a trapezoidal shape, as illustrated in FIGS. 10A and 10B. The height of the trapezoid (ha, hb) may vary by adjusting the ratio of L1:L2. For example, as illustrated in FIG. 10A, a convex portion shape prepared when the L1:L2 ratio is 1:1, and as illustrated in FIG. 10B, a convex portion shape prepared when the L1:L2 ratio is 2:1, and the m1:m2 ratio is 1:1 and the o1:o2 ratio is 1:8.

In an exemplary embodiment of the present specification, the convex portion or concave portion shape includes two or more of the convex portion or concave portion shapes. By having two or more of the convex portion or concave portion shapes as above, dichroism may increase. Herein, the two or more convex portion or concave portion shapes may have a form of repeating identical shapes, however, shapes different from each other may be included, as illustrated in FIGS. 11, 12, 13A and 13B.

FIG. 11 illustrates two or more convex portion shapes that are different from each other being alternately arranged. A shape in which a second convex portion (P2) having a smaller height compared to the convex portion is disposed between the convex portions (P1) may be obtained. Hereinafter, the convex portion stated prior to the second convex portion may be referred to as a first convex portion.

FIG. 12 illustrates a concave portion being included between two or more convex portion shapes. The light absorbing layer surface may have a shape further including a concave portion (P3) having a smaller height compared to the convex portion on a tip portion (pointed part) of the convex portion (P1). Such a decoration element may exhibit an effect of an image color softly changing depending on a viewing angle.

As illustrated in FIGS. 13A and 13B, each shape may be arranged in an inversed phase structure. Like this, the light absorbing layer includes a convex portion or concave portion shape, and each of the shapes may be arranged in an inversed phase structure.

Specifically, as illustrated in FIG. 13A, the light absorbing layer surface may have a shape of a plurality of convex portions being arranged in an inversed phase structure of 180 degrees. Specifically, the light absorbing layer surface may include a first area (C1) in which the second inclined surface has a larger angle of inclination compared to the first inclined surface, and a second area (C2) in which the second inclined surface has a larger angle of inclination compared to the first inclined surface. In one example, the convex portion included in the first area may be referred to as a first convex portion (P1), and the convex portion included in the second area may be referred to as a fourth convex portion (P4). As for heights, widths, angle of inclinations and an angle formed by the first and the second inclined surfaces of the first convex portion (P1) and the fourth convex portion (P4), descriptions provided in the convex portion (P1) section may be used in the same manner.

As illustrated in FIG. 13B, any one area of the first area and the second area corresponds to an image or a logo, and the other area corresponds to a background part. Such a decoration element may exhibit an effect of an image or logo color softly changing depending on a viewing angle. In addition, a decorative effect of colors of an image or logo part and a background part looking switched depending on a viewing direction.

The first area and the second area may each include a plurality of convex portions. Widths and the number of convex portions of the first area and the second area may be properly controlled depending on the size of a target image or logo.

In an exemplary embodiment of the present specification, the light absorbing layer includes two or more convex portion shapes, and may further include a flat portion in all or a part between each convex portion shape.

As illustrated in FIGS. 7A and 7B, a flat portion (G1) may be included between each convex portion of the light absorbing layer. The flat portion means an area where a convex portion is not present. Other than the light absorbing layer further including a flat portion, descriptions on the remaining constituents (D1, D2, c1, c2, c3, first inclined side and second inclined side) are the same as the descriptions provided above. Meanwhile, the combined length of D1+D2+G1 is defined as a pitch of the pattern, which is different from the width of the pattern described above.

A height (H1) of the convex portion (P1) may be from 5 µm to 30 µm. Having the convex portion height in the above-mentioned range may be advantageous in a production process aspect. In the present specification, the convex portion height may mean a shortest distance between the highest part and the lowest part of the convex portion based on the horizontal surface of the light absorbing layer. As for the descriptions relating to the height of the convex portion, the same numerical range may also be used in the depth of the concave portion described above.

A width (W1) of the convex portion (P1) may be from 10 µm to 90 µm. Having the convex portion width in the above-mentioned range may be advantageous during processing and formation of a pattern. The width of the convex portion (P1) may be, for example, 10 µm or greater, 15 µm or greater, 20 µm or greater or 25 µm or greater, and may be 90 µm or less, 80 µm or less, 70 µm or less, 60 µm or less, 50 µm or less, 40 µm or less or 35 µm or less. The descriptions relating to the width may be used in the concave portion described above as well as the convex portion.

A distance between the convex portions (P1) may be from 0 µm to 20 µm. The distance between the convex portions in the present specification may mean, in two adjacent convex portions, a shortest distance between a point where one convex portion ends and a point where another convex portion starts.

When properly maintaining the distance between the convex portions, a phenomenon of a reflection area looking dark due to shading when a relatively bright color is to be obtained may be improved when looking at the decoration element from an inclined surface side of the convex portion having a larger angle of inclination. Between the convex portions, a second convex portion with a smaller height compared to the convex portion may be present as to be described later. The descriptions relating to the distance may be used in the concave portion described above as well as the convex portion.

A height (H2) of the second convex portion (P2) may be in a range of ⅕ to ¼ of the height (H1) of the first convex portion (P1). For example, a height difference (H1−H2) between the first convex portion and the second convex portion may be from 10 μm to 30 μm. A width (W2) of the second convex portion may be from 1 μm to 10 μm. Specifically, the width (W2) of the second convex portion may be 1 μm or greater, 2 μm or greater, 3 μm or greater, 4 μm or greater or 4.5 μm or greater, and may be 10 μm or less, 9 μm or less, 8 μm or less, 7 μm or less, 6 μm or less or 5.5 μm or less.

In an exemplary embodiment of the present specification, the second convex portion may have two inclined surfaces (S3, S4) having different angle of inclinations. An angle (a4) formed by the two inclined surfaces of the second convex portion may be from 20 degrees to 100 degrees. Specifically, the angle (a4) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An angle of inclination difference (a6−a5) between both inclined surfaces of the second convex portion may be from 0 degrees to 60 degrees. The angle of inclination difference (a6−a5) may be 0 degrees or greater, 10 degrees or greater, 20 degrees or greater, 30 degrees or greater, 40 degrees or greater or 45 degrees or greater, and may be 60 degrees or less or 55 degrees or less. The second convex portion having a dimension in the above-mentioned range may be advantageous in terms of forming bright color by increasing light inflow from a side surface having a large inclined surface angle.

In an exemplary embodiment of the present specification, a height (H3) of the concave portion (P3) may be from 3 μm to 15 μm. Specifically, a height (H3) of the concave portion (P3) may be 3 μm or greater, and may be 15 μm or less, 10 μm or less or 5 μm or less. The concave portion may have two inclined surfaces (S5, S6) having different angle of inclinations. An angle (a7) formed by the two inclined surfaces of the concave portion may be from 20 degrees to 100 degrees. Specifically, the angle (a7) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An angle of inclination difference (a9−a8) between both inclined surfaces of the concave portion may be from 0 degrees to 60 degrees. The angle of inclination difference (a9−a8) may be 0 degrees or greater, 10 degrees or greater, 20 degrees or greater, 30 degrees or greater, 40 degrees or greater or 45 degrees or greater, and may be 60 degrees or less or 55 degrees or less. The concave portion having a dimension in the above-mentioned range may be advantageous in terms that a color sense may be added on the inclined surface.

According to an exemplary embodiment, the light absorbing layer includes a pattern in which an upper surface has a cone-shaped protrusion or groove. The cone shape includes a shape of a circular cone, an oval cone or a polypyramid. Herein, the shape of the bottom surface of the polypyramid includes a triangle, a square, a star shape having 5 or more protruding points, and the like. The cone shape may have a shape of a protrusion formed on an upper surface of the light absorbing layer, or a shape of a groove formed on an upper surface of the light absorbing layer. The protrusion has a triangular cross-section, and the groove has an inverted triangular cross-section. A lower surface of the light absorbing layer may also have the same shape as the upper surface of the light absorbing layer.

According to an exemplary embodiment, the cone-shaped pattern may have an asymmetric structure. For example, when rotating the cone-shaped pattern 360 degrees based on the vertex of the cone and observing from the upper surface, developing dichroism from the pattern when three or more same shapes are present is difficult. However, when rotating the cone-shaped pattern 360 degrees based on the vertex of the cone and observing from the upper surface, dichroism may develop when two or less identical shapes are present. FIG. 14 illustrates an upper surface of symmetric-structured cone shapes and asymmetric-structured cone shapes.

The symmetric-structured cone shape has a structure in which a cone-shaped bottom surface is a circle or a regular polygon having the same side lengths, and the vertex of the cone is present on a vertical line of the center of gravity of the bottom surface. The asymmetric-structured cone shape has a structure in which, when observed from the upper surface, the position of the vertex of the cone is present on a vertical line of a point that is not the center of gravity of the bottom surface, or has a structure in which the bottom surface is an asymmetric-structured polygon or oval. When the bottom surface is an asymmetric-structured polygon, at least one of the sides and the angles of the polygon may be designed to be different from the rest.

For example, as illustrated in FIG. 15, the position of the vertex of the cone may be changed. Specifically, when designing the vertex of the cone to be located on a vertical line of the center of gravity (O1) of the bottom surface when observing from the upper surface as in the first structure illustrated in FIG. 15, 4 identical structures may be obtained when rotating 360 degrees based on the vertex of the cone (4-fold symmetry). However, the symmetric structure is broken by designing the vertex of the cone on a position (O2) that is not the center of gravity (O1) of the bottom surface. When employing a length of one side of the bottom surface as x, migration distances of the vertex of the cone as a and b, a height of the cone shape, a length of a line vertically connecting from the vertex of the cone (O1 or O2) to the bottom surface, as h, and an angle formed by the bottom surface and a side surface of the cone as θn, cosine values for Surface 1, Surface 2, Surface 3 and Surface 4 of FIG. 15 may be obtained as follows, respectively:

$$\cos(\Theta 1) = \frac{\left(\frac{x}{2}\right)}{sqrt\left(h^2 + \left(\frac{x}{2}\right)^2\right)} \quad \cos(\Theta 3) = \frac{\left(\frac{x}{2} - a\right)}{sqrt\left(h^2 + \left(\frac{x}{2} - a\right)^2\right)}$$

$$\cos(\Theta 2) = \frac{\left(\frac{x}{2}\right)}{sqrt\left(h^2 + \left(\frac{x}{2}\right)^2\right)} \quad \cos(\Theta 3) = \frac{\left(\frac{x}{2} - b\right)}{sqrt\left(h^2 + \left(\frac{x}{2} - b\right)^2\right)}$$

Herein, θ1 and θ2 are the same, and therefore, there is no dichroism. However, θ3 and θ4 are different, and |θ3−θ4| means a color difference between two colors (ΔE*ab), and therefore, dichroism may be obtained. Herein, |θ3−θ4|>0. As above, the extent to which the symmetric structure is broken, that is, a degree of asymmetry, may be represented quantitatively using an angle formed by the horizontal cross-section with respect to the ground and a side surface of the cone, and the value representing such a degree of asymmetry is proportional to a color difference of dichroism.

FIGS. 16A and 16B illustrate a surface having a convex portion shape in which the highest point has a line shape. FIG. 16A illustrates a pattern having a convex portion developing no dichroism and FIG. 16B illustrates a pattern having a convex portion developing dichroism. An X-X' cross-section of FIG. 16A is an isosceles triangle or an equilateral triangle, and a Y-Y' cross-section of FIG. 16B is a triangle having different side lengths.

In an exemplary embodiment of the present specification, the light absorbing layer has a surface of a convex portion shape in which the highest point has a line shape or a concave portion shape in which the lowest point has a line shape. The line shape may be a straight-line shape or a curved-line shape, and may include both a curve and a straight line, or a zigzag shape. This is shown in the scanning electron microscopy (SEM) images of FIGS. 17 to 19. When observing the surface of the convex portion shape in which the highest point has a line shape or the concave portion shape in which the lowest point has a line shape from a surface side of the convex portion or concave portion shape, having only one identical shape when rotating 360 degrees based on the center of gravity of the horizontal cross-section with respect to the ground of the convex portion or the concave portion is advantageous in developing dichroism.

In an exemplary embodiment of the present specification, the light absorbing layer has a surface of a convex portion or concave portion shape in which a cone-type tip portion is cut. As shown in the SEM images of FIG. 20, when placing a decoration element on the ground, an inversed trapezoidal concave portion in which a cross-section perpendicular to the ground is asymmetric. Such an asymmetric cross-section may have a trapezoidal or inversed trapezoidal shape. In this case, dichroism may also be developed by the asymmetric-structured cross-section.

In addition to the structures illustrated above, various surfaces of convex portion or concave portion shapes may be obtained, as illustrated in FIG. 21.

In the present specification, unless mentioned otherwise, the "surface" may be a flat surface, but is not limited thereto, and a part or all may be a curved surface. For example, the shape of a cross-section in a direction perpendicular to the surface may include a structure of a part of an arc of a circle or oval, a wave structure or a zigzag.

According to another exemplary embodiment of the present application, the light absorbing layer may include two or more regions with different thicknesses.

Examples of the structure according to the embodiment are illustrated in FIG. 22 and FIG. 23. FIG. 22 and FIG. 23 illustrate a structure in which a substrate (101), a light reflective layer (201) and a light absorbing layer (301) are laminated (substrate is not included in FIG. 22). FIG. 22 and FIG. 23 illustrate a structure in which the substrate (101) is provided on the light reflective layer (201) side, however, the structure is not limited thereto, and the substrate (101) may also be provided on the light absorbing layer (301) side. As illustrated in FIG. 22 and FIG. 23, the light absorbing layer (301) has two or more points with different thicknesses. As illustrated in FIG. 22, thicknesses in A point and B point are different in the light absorbing layer (301), and as illustrated in FIG. 23, thicknesses in C region and D region are different in the light absorbing layer (301).

According to another exemplary embodiment of the present application, the light absorbing layer includes one or more regions in which an upper surface has an inclined surface with an angle of inclination of greater than 0 degrees and less than or equal to 90 degrees, and the light absorbing layer includes one or more regions having a thickness different from a thickness in any one region having the inclined surface.

Surface properties such as an upper surface slope of the light reflective layer may be the same as an upper surface of the light absorbing layer. For example, by using a deposition method when forming the light absorbing layer, the upper surface of the light absorbing layer may have the same slope as the upper surface of the light reflective layer.

FIG. 24 illustrates a structure of a decoration element having a light absorbing layer in which an upper surface has an inclined surface. The structure is a structure laminating a substrate (101), a light reflective layer (201) and a light absorbing layer (301), and thickness t1 in E region and thickness t2 in F region are different in the light absorbing layer (301).

FIG. 24 relates to a light absorbing layer having inclined surfaces facing each other, that is, having a structure with a triangle cross-section. In the structure of the pattern having inclined surfaces facing each other, as illustrated in FIG. 24, a thickness of the light absorbing layer may be different in two surfaces of the triangle structure even when progressing deposition under the same condition. Accordingly, a light absorbing layer having two or more regions with different thicknesses may be formed using just one process. As a result, developed colors may become different depending on the thickness of the light absorbing layer. Herein, the thickness of the light reflective layer does not affect changes in the color when it is a certain thickness or greater.

FIG. 24 illustrates a structure in which a substrate (101) is provided on a light reflective layer (201) side, however, the structure is not limited thereto, and as described above, the substrate (101) may also be disposed on other locations. In addition, in FIG. 24, the surface adjoining the light reflective layer (201) of the substrate (101) is a flat surface, however, the surface adjoining the light reflective layer (201) of the substrate (101) may have a pattern having the same slope as an upper surface of the light reflective layer (201). This may cause a difference in the thickness of the light absorbing layer due to a difference in the slope of the pattern of the substrate. However, the present disclosure is not limited thereto, and even when the substrate and the light absorbing layer are prepared to have different slopes using different deposition methods, the dichroism described above may be obtained by having the thickness of the light absorbing layer being different on both sides of the pattern.

According to another exemplary embodiment of the present application, the light absorbing layer includes one or more regions with a gradually changing thickness. FIG. 25 illustrates a structure in which a thickness of the light absorbing layer gradually changes.

According to another exemplary embodiment of the present application, the light absorbing layer includes one or more regions in which an upper surface has an inclined surface with an angle of inclination of greater than 0 degrees and less than or equal to 90 degrees, and at least one region having the inclined surface has a structure in which a thickness of the light absorbing layer gradually changes. FIG. 25 illustrates a structure of a light absorbing layer including a region in which an upper surface has an inclined surface. In FIG. 25, both G region and H region have a structure in which an upper surface of the light absorbing layer has an inclined surface, and a thickness of the light absorbing layer gradually changes.

According to an exemplary embodiment, the light absorbing layer includes a first region having a first inclined surface with an angle of inclination in a range of 1 degree to 90 degrees, and may further include a second region in which an upper surface has an inclined surface with a different slope direction or a different angle of inclination from the first inclined surface, or an upper surface is horizontal. Herein, thicknesses in the first region and the second region may be different from each other in the light absorbing layer.

According to another exemplary embodiment, the light absorbing layer includes a first region having a first inclined surface with an angle of inclination in a range of 1 degree to 90 degrees, and may further include two or more regions in which an upper surface has an inclined surface with a different slope direction or a different angle of inclination from the first inclined surface, or an upper surface is horizontal. Herein, thicknesses in the first region and the two or more regions may all be different from each other in the light absorbing layer.

According to another exemplary embodiment of the present application, the color developing layer includes a color film provided on a surface opposite to the surface facing the light absorbing layer of the light reflective layer, between the light reflective layer and the light absorbing layer, or on a surface opposite to the surface facing the light reflective layer of the light absorbing layer.

The color film is not particularly limited as long as it has a color difference ΔE*ab, a distance in space of L*a*b* in a color coordinate CIE L*a*b* of the color developing layer, of greater than 1 when the color film is present compared to when the color film is not present.

Colors may be expressed by CIE L*a*b*, and a color difference may be defined using a distance (ΔE*ab) in the L*a*b* space. Specifically, the color difference is $$\Delta E\cdot ab = \sqrt{(\Delta L)^2 + (\Delta a)^2 + (\Delta b)^2},$$

and within a range of 0<ΔE*ab<1, an observer may not recognize the color difference [See e.g., Machine Graphics and Vision 20(4):383-411 (2011)]. Accordingly, a color difference obtained by the color film addition may be defined by ΔE*ab>1 in the present specification.

FIGS. 26A to 26C illustrate a color developing layer including a color film. FIG. 26A illustrates a structure in which a light reflective layer (201), a light absorbing layer (301) and a color film (401) are consecutively laminated, FIG. 26B illustrates a structure in which a light reflective layer (201), a color film (401) and a light absorbing layer (301) are consecutively laminated, and FIG. 26C illustrates a structure in which a color film (401), a light reflective layer (201) and a light absorbing layer (301) are consecutively laminated.

The color film may also perform a role of a substrate. For example, those that may be used as a substrate may be used as a color film by adding a dye or a pigment thereto.

The substrate may be provided on a surface opposite to the surface facing the light absorbing layer of the light reflective layer, as illustrated in FIG. 27A; or on a surface opposite to the surface facing the light reflective layer of the light absorbing layer, as illustrated in FIG. 27B.

For example, when the substrate is provided on a surface opposite to the surface facing the light absorbing layer of the light reflective layer, and the color film is located on a surface opposite to the surface facing the light absorbing layer of the light reflective layer, the color film may be provided between the substrate and the light reflective layer; or on a surface opposite to the surface facing the light reflective layer of the substrate. As another example, when the substrate is provided on a surface opposite to the surface facing the light reflective layer of the light absorbing layer, and the color film is located on a surface opposite to the surface facing the light reflective layer of the light absorbing layer, the color film may be provided between the substrate and the light absorbing layer; or on a surface opposite to the surface facing the light absorbing layer of the substrate.

According to another exemplary embodiment of the present application, the substrate is provided on a surface opposite to the surface facing the light absorbing layer of the light reflective layer, and the color film is further provided. FIG. 28A illustrates a structure in which the color film (401) is provided on a surface opposite to the light reflective layer (201) side of the light absorbing layer (301), FIG. 28B illustrates a structure in which the color film (401) is provided between the light absorbing layer (301) and the light reflective layer (201), FIG. 28C illustrates a structure in which the color film (401) is provided between the light reflective layer (201) and the substrate (101), and FIG. 28D illustrates a structure in which the color film (401) is provided on a surface opposite to the light reflective layer (201) side of the substrate (101). FIG. 28E illustrates a structure in which the color films (401*a*, 401*b*, 401*c*, 401*d*) are provided on a surface opposite to the light reflective layer (201) side of the light absorbing layer (301), between the light absorbing layer (301) and the light reflective layer (201), between the light reflective layer (201) and the substrate (101), and on a surface opposite to the light reflective layer (201) side of the substrate (101), respectively, however, the structure is not limited thereto, and 1 to 3 of the color films (401*a*, 401*b*, 401*c*, 401*d*) may not be included.

According to another exemplary embodiment of the present application, the substrate is provided on a surface opposite to the surface facing the light reflective layer of the light absorbing layer, and the color film is further provided. FIG. 29A illustrates a structure in which the color film (401) is provided on a surface opposite to the light absorbing layer (301) side of the substrate (101), FIG. 29B illustrates a structure in which the color film (401) is provided between the substrate (101) and the light absorbing layer (301), FIG. 29C illustrates a structure in which the color film (401) is provided between the light absorbing layer (301) and the light reflective layer (201), and FIG. 29D illustrates a structure in which the color film (401) is provided on a surface opposite to the light absorbing layer (301) side of the light reflective layer (201). FIG. 29E illustrates a structure in which the color films (401*a*, 401*b*, 401*c*, 401*d*) are provided on a surface opposite to the light absorbing layer (201) side of the substrate (101), between the substrate (101) and the light absorbing layer (301), between the light absorbing layer (301) and the light reflective layer (201), and on a surface opposite to the light absorbing layer (201) side of the light reflective layer (201), respectively, however, the structure is not limited thereto, and 1 to 3 of the color films (401*a*, 401*b*, 401*c*, 401*d*) may not be included.

In the structures illustrated in FIG. 28B and FIG. 29C, the light reflective layer may reflect light entering through the color film when the color film has visible light transmittance of greater than 0%, and therefore, colors may be obtained by laminating the light absorbing layer and the light reflective layer.

In the structures illustrated in FIG. 28C, FIG. 28D and FIG. 29D, light transmittance of the colors developed from the color film of the light reflective layer (201) may be 1% or greater, preferably 3% or greater and more preferably 5% or greater so that changes in the color difference obtained by the color film addition may be recognized. This is due to the fact that light transmitted in such a visible light transmittance range may be mixed with colors obtained by the color film.

The color film may be provided as one sheet, or as a laminate of 2 sheets or more that are the same or different types.

As the color film, those capable of developing target colors by combining with colors developed from the laminated structure of the light reflective layer and the light absorbing layer described above may be used. For example, color films expressing colors by one, two or more types of pigments and dyes being dispersed into a matrix resin may be used. Such a color film may be formed by directly coating a composition for forming a color film on a color film-providable location, or a method of preparing a color film by coating a composition for forming a color film on a separate substrate or using a known molding method such as casting or extrusion, and then disposing or attaching the color film on a color film-providable location may be used. As the coating method, wet coating or dry coating may be used.

The pigment and the dye capable of being included in the color film may be selected from among those capable of obtaining target colors from a final decoration member, and known in the art, and one, two or more types among pigments and dyes such as red-based, yellow-based, purple-based, blue-based or pink-based may be used. Specifically, dyes such as perinone-based red dyes, anthraquinone-based red dyes, methane-based yellow dyes, anthraquinone-based yellow dyes, anthraquinone-based purple dyes, phthalocyanine-based blue dyes, thioindigo-based pink dyes or isoxindigo-based pink dyes may be used either alone or as a combination. Pigments such as carbon black, copper phthalocyanine (C.I. Pigment Blue 15:3), C.I. Pigment Red 112, Pigment blue or isoindoline yellow may be used either alone or as a combination. As such dyes or pigments, those commercially available may be used, and for example, materials manufactured by Ciba ORACET or Chokwang Paint Ltd. may be used. Types of the dyes or pigments and colors thereof are for illustrative purposes only, and various known dyes or pigments may be used, and more diverse colors may be obtained therefrom.

As the matrix resin included in the color film, materials known as materials of transparent films, primer layers, adhesive layers or coating layers may be used, and the matrix resin is not particularly limited to these materials. For example, various materials such as acryl-based resins, polyethylene terephthalate-based resins, urethane-based resins, linear olefin-based resins, cycloolefin-based resins, epoxy-based resins or triacetylcellulose-based resins may be selected, and copolymers or mixtures of the materials illustrated above may also be used.

When the color film is disposed closer to the location observing a decoration member than the light reflective layer or the light absorbing layer as in, for example, the structures illustrated in FIGS. 28A and 28B, and FIGS. 29A to 29C, light transmittance of the colors developed by the color film from the light reflective layer, the light absorbing layer or the laminated structure of the light reflective layer and the light absorbing layer may be 1% or greater, preferably 3% or greater and more preferably 5% or greater. As a result, target colors may be obtained by combining colors developed from the color film and colors developed from the light reflective layer, the light absorbing layer or the laminated structure thereof.

The thickness of the color film is not particularly limited, and those skilled in the art may select and set the thickness as long as it is capable of obtaining target colors. For example, the color film may have a thickness of 500 nm to 1 mm.

The light absorbing layer may implement various colors depending on a refractive index (n), an extinction coefficient (k) and a thickness (t). FIG. 30 is a graph showing the variation in reflectance based on wavelength depending on a thickness of the light absorbing layer, and FIG. 31 is an image showing the colors obtained therefrom. Specifically, FIG. 30 is a reflectance simulation graph by CuO deposition thickness of CuO/Cu, and is a material prepared while varying a CuO thickness from 10 nm to 60 nm under the same deposition condition.

FIG. 32 is an image showing a simulation result indicating that different colors are observed depending on a viewing angle. FIG. 32 is a simulation result of CuON/Al. In FIG. 32, the thickness of the light absorbing layer increases from 10 nm to 100 nm by 10 nm, and an incident angle is adjusted from 0 degrees to 60 degrees at a 15 degrees interval. Through such a simulation result, it is seen that, in the structure according to an exemplary embodiment of the present application, various colors may be obtained by adjusting a thickness of a light absorbing layer and an angle of inclination of an upper surface. By being provided with a color film in addition thereto, more diverse colors may be obtained.

In FIG. 32, L*a*b* coordinate values of A1 to A5 are each (91,3,5), L*a*b* coordinate values of B1 to B5 are (74,14,8), (74,14,8), (72,15,10), (69,15,11) and (66,16,13), respectively, L*a*b* coordinate values of C1 to C5 are (46,22,−11), (45,22,−10), (43,25,−9), (40,28,−4) and (42,30,6), respectively, L*a*b* coordinate values of D1 to D5 are (36,−12,−22), (35,−11,−23), (30,−7,−24), (20,6,−26) and (18,38,−12), respectively, L*a*b* coordinate values of E1 to E5 are (49,−20,−7), (48,−20,−7), (43,−20,−8), (34,−18,39) and (18,7,−10), respectively, L*a*b* coordinate values of F1 to F5 are (60,−10,4), (59,−10,4), (55,−11,4), (47,−11,4) and (31,−4,3), respectively, L*a*b* coordinate values of G1 to G5 are (66,−4,10), (65,−4,10), (62,−4,10), (54,−5,11) and (40,−2,10), respectively, L*a*b* coordinate values of H1 to H5 are (69,1,11), (68,1,12), (64,1,13), (58,1,14) and (44,2,13), respectively, L*a*b* coordinate values of I1 to I5 are (68,5,11), (67,5,11), (64,5,12), (58,6,14) and (41,7,14), respectively, and L*a*b* coordinate values of J1 to J5 are (66,8,8), (65,8,8), (62,8,10), (56,9,11) and (43,11,11), respectively.

The light reflective layer is not particularly limited as long as it is a material capable of reflecting light, however, light reflectance may be determined depending on the material, and for example, colors are readily expressed at 50% or greater. Light reflectance may be measured using an ellipsometer.

The light absorbing layer preferably has a refractive index (n) of 0 to 8 at 400 nm, and the refractive index may be from 0 to 7, may be from 0.01 to 3, and may be from 2 to 2.5. The refractive index (n) may be calculated by sin θ1/sin θ2 (θ1 is an angle of light incident on a surface of the light absorbing layer, and θ2 is a refraction angle of light inside the light absorbing layer).

The light absorbing layer preferably has a refractive index (n) of 0 to 8 at 380 nm to 780 nm, and the refractive index may be from 0 to 7, may be from 0.01 to 3, and may be from 2 to 2.5.

The light absorbing layer may have an extinction coefficient (k) of greater than 0 and less than or equal to 4 at 400 nm, and the extinction coefficient (k) is preferably from 0.01 to 4, may be from 0.01 to 3.5, may be from 0.01 to 3, and may be from 0.1 to 1. The extinction coefficient (k) is −λ/4πI (dI/dx) (herein, a value multiplying Δ/4π with dI/I, a reduced fraction of light intensity per a path unit length (dx), for example 1 m, in the light absorbing layer, and herein, λ is a wavelength of light).

The light absorbing layer may have an extinction coefficient (k) of greater than 0 and less than or equal to 4 at 380 nm to 780 nm, and the extinction coefficient (k) is preferably from 0.01 to 4, may be from 0.01 to 3.5, may be from 0.01 to 3, and may be from 0.1 to 1.

The extinction coefficient (k) is in the above-mentioned range at 400 nm, preferably in the whole visible wavelength region of 380 nm to 780 nm, and therefore, a role of the light absorbing layer may be performed in the visible range.

For example, using a method of absorbing light by adding a dye to a resin, and using a material having an extinction coefficient as described above leads to different light absorption spectra. When absorbing light by adding a dye to a resin, an absorption wavelength band is fixed, and only a phenomenon of varying an absorption amount depending on the changes in the coating thickness occurs. In addition, in order to obtain a target light absorption amount, changes in the thickness of at least a few micrometers or more are required to adjust the light absorption amount. On the other hand, in materials having an extinction coefficient, a wavelength band absorbing light changes even when the thickness changes by a several to tens of nanometer scale.

According to an exemplary embodiment, the light reflective layer may be a metal layer, a metal oxide layer, a metal nitride layer, a metal oxynitride layer or an inorganic material layer. The light reflective layer may be formed in a single layer, or may be formed in a multilayer of two or more layers.

As one example, the light reflective layer may be a single layer or a multilayer including one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof, and one, two or more types of materials among carbon and carbon composites. For example, the light reflective layer may include alloys of two or more selected from among the above-mentioned materials, or oxides, nitrides or oxynitrides thereof. According to another embodiment, the light reflective layer may allow highly resistant reflective layer by being prepared using an ink including carbon or carbon composites. Carbon black, CNT and the like may be included as the carbon or carbon composites. The ink including carbon or carbon composites may include above-described materials, or oxides, nitrides or oxynitrides thereof, and for example, oxides of one, two or more types selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag) may be included. A curing process may be further carried out after printing the ink including carbon or carbon composites.

When the light reflective layer includes two or more types of materials, the two or more types of materials may be formed using one process, for example, a method of deposition or printing, however, a method of first forming a layer using one or more types of materials, and then additionally forming a layer thereon using one or more types of materials may be used. For example, a light reflective layer may be formed by forming a layer through depositing indium or tin, then printing an ink including carbon, and then curing the result. The ink may further include oxides such as titanium oxides or silicon oxides.

According to an exemplary embodiment, the light absorbing layer may be a single layer, or a multilayer of two or more layers.

The light absorbing layer may be formed with materials having an extinction coefficient (k) at 400 nm, preferably at 380 nm to 780 nm, that is, materials having an extinction coefficient of greater than 0 and less than or equal to 4, preferably 0.01 to 4. For example, the light absorbing layer may include one, two or more selected from the group consisting of metals, metalloids, and oxides, nitrides, oxynitrides and carbides of metals or metalloids. The oxides, nitrides, oxynitrides or carbides of metals or metalloids may be formed under a deposition condition and the like set by those skilled in the art. The light absorbing layer may also include the same metals, metalloids, alloys or oxynitrides of two or more types as the light reflective layer.

For example, the light absorbing layer may be a single layer or a multilayer including one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof. As specific examples, the light absorbing layer includes one, two or more types selected from among copper oxides, copper nitrides, copper oxynitrides, aluminum oxides, aluminum nitrides, aluminum oxynitrides and molybdenum titanium oxynitrides.

According to an exemplary embodiment, the light absorbing layer includes silicon (Si) or germanium (Ge).

The light absorbing layer formed with silicon (Si) or germanium (Ge) may have a refractive index (n) of 0 to 8, or 0 to 7 at 400 nm, and may have an extinction coefficient (k) of greater than 0 and less than or equal to 4, preferably 0.01 to 4, and the extinction coefficient (k) may be from 0.01 to 3 or from 0.01 to 1.

According to another exemplary embodiment, the light absorbing layer includes one, two or more types selected from among copper oxides, copper nitrides, copper oxynitrides, aluminum oxides, aluminum nitrides, aluminum oxynitrides and molybdenum titanium oxynitrides. In this case, the light absorbing layer may have a refractive index (n) of 1 to 3, for example, 2 to 2.5 at 400 nm, and an extinction coefficient (k) of greater than 0 and less than or equal to 4, preferably 0.01 to 2.5, preferably 0.2 to 2.5 and more preferably 0.2 to 0.6.

According to an exemplary embodiment, the light absorbing layer is AlOxNy (x>0, y>0).

According to another exemplary embodiment, the light absorbing layer may be AlOxNy (0≤x≤1.5, 0≤y≤1).

According to another exemplary embodiment, the light absorbing layer is AlOxNy (x>0, y>0), and with respect to the total number of atoms 100%, the number of each atom satisfies the following equation:

$$1 < \frac{(Al)at \times 3}{(O)at \times 2 + (N)at \times 3} < 2.$$

According to an exemplary embodiment, the light absorbing layer may be formed with materials having an extinction coefficient (k) at 400 nm, preferably at 380 nm to 780 nm, and for example, the light absorbing layer/light reflective layer may be formed with materials such as CuO/Cu, CuON/Cu, CuON/Al, AlON/Al, AlN/AL/AlON/Cu or AlN/Cu.

According to an exemplary embodiment, the thickness of the light reflective layer may be determined depending on target colors in a final structure, and for example, may be 1 nm or greater, preferably 25 nm or greater, for example, 50 nm or greater, and preferably 70 nm or greater.

According to an exemplary embodiment, the thickness of the light absorbing layer may be from 5 nm to 500 nm, for example, from 30 nm to 500 nm.

According to an exemplary embodiment, a difference in the thickness by the region of the light absorbing layer is from 2 nm to 200 nm, and may be determined depending on a target color difference.

According to an exemplary embodiment, a substrate provided on a lower surface of the light reflective layer or an upper surface of the light absorbing layer may be further included. Surface properties such as an upper surface slope of the substrate may be the same as upper surfaces of the light reflective layer and the light absorbing layer. By forming the light reflective layer and the light absorbing layer using a deposition method, the substrate, the light reflective layer and the light absorbing layer may have an inclined surface with the same angle. For example, the structure as above may be obtained by forming an inclined surface or a three-dimensional structure on an upper surface of a substrate, and depositing a light reflective layer and a light absorbing layer thereon in this order, or depositing a light absorbing layer and a light reflective layer in this order.

According to an exemplary embodiment, forming an inclined surface or a three-dimensional structure on the substrate surface may be carried out using a method of foaming a pattern on an ultraviolet curable resin and curing the result using ultraviolet rays, or processing with laser. According to an exemplary embodiment, the decoration element may be a deco film or a case of a mobile device. The decoration element may further include a gluing layer as necessary.

Materials of the substrate are not particularly limited, and ultraviolet curable resins known in the art may be used when forming an inclined surface or a three-dimensional structure using methods as above.

On the light absorbing layer, a protective layer may be further provided.

According to an exemplary embodiment, an adhesive layer may be further provided on an opposite surface of the substrate provided with the light absorbing layer or the light reflective layer. This adhesive layer may be an optically clear adhesive (OCA) layer. As necessary, a peel-off layer (release liner) may be further provided on the adhesive layer for protection.

Deposition such as a sputtering method has been described as an example of forming the light reflective layer and the light absorbing layer in the present specification, however, various methods of preparing a thin film may be used as long as constitutions and properties according to embodiments described in the present specification are obtained. For example, a vapor deposition method, a chemical vapor deposition (CVD) method, wet coating and the like may be used.

In an exemplary embodiment of the present application, an in-mold label layer is provided on one surface of the color developing layer. The in-mold label layer may include one or more types of acrylonitrile butadiene styrene (ABS), polymethyl methacrylate (PMMA), polycarbonate (PC), acrylonitrile-styrene (AS), styrene-acrylonitrile (SAN), polyethylene terephthalate (PET) and polypropylene (PP). In addition, the in-mold label layer may further include a print layer.

Generally, a method of introducing a label into a mold, and, while forming a plastic film in the mold, forming a label on the plastic film is called an in-mold labeling process. The in-mold labeling process has advantages of reducing storage space of a product being manufactured and shipping instantly since there is no need to attach a label after plastic film molding or to store a molded product during manufacturing.

In an exemplary embodiment of the present application, the print layer of the in-mold label layer may include information such as letters or images. More specifically, the print layer of the in-mold label layer may include a printed matter such as a bar code, a manufacturer, a sales company name, a character, a product name or a usage instruction.

The in-mold label layer may be prepared using in-mold molding methods known in the art. More specifically, the in-mold label layer may be prepared using in-mold molding methods such as blow molding, injection molding or differential pressure molding, however, the method is not limited thereto.

In an exemplary embodiment of the present application, the in-mold label layer and the color developing layer may be adhered to each other by an adhesive layer such as an optically clear adhesive (OCA) layer. More specifically, the in-mold label layer and the color developing layer may be adhered to each other by an in-mold labeling process in which the in-mold label layer material is injected onto the adhesive-coated color developing layer.

Hereinafter, the present disclosure will be described in more detail with reference to examples. However, the following examples are for illustrative purposes only, and are not to limit the scope of the present disclosure.

EXAMPLE

Example 1

An aluminum oxynitride light absorbing layer having a thickness of 20 nm was prepared on a PET film using reactive sputtering deposition under a vacuum condition of 3 mtorr process pressure. The deposition process was performed under a vacuum condition of $3 \times 10^{-6}$ torr base pressure of and 3 mtorr process pressure, the Ar gas was adjusted to 100 sccm, and the reactive gas partial pressure section was 40%. Using Black InK (reflectance 5%) as a light reflective layer, 4 degree printing was progressed using screen printing. After coating an adhesive on the printed film, the result was molded and trimmed, placed in a mold and injected for integration (in-mold labeling). As a resin material, ABS was used. The light absorbing layer may include a prism-type shape having an asymmetric-structured cross-section.

Photographs of the front and the back of the controller product of the electronic device manufactured through the in-mold labeling process are shown in FIG. 33, and a photograph of a product attaching this to a plastic molded product using an inlay process is shown in FIG. 34.

Comparative Example 1

An aluminum oxynitride light absorbing layer having a thickness of 20 nm was prepared on a PET film using reactive sputtering deposition under a vacuum condition of 3 mtorr process pressure. The deposition process was performed under a vacuum condition of $3\times10^{-6}$ torr base pressure of and 3 mtorr process pressure, the Ar gas was adjusted to 100 sccm, and the reactive gas partial pressure section was 40%. Using Black InK (reflectance 5%) as a light reflective layer, 4 degree printing was progressed using screen printing. The printed film went through a protective film laminating process, and then punched to fit the size of the product using a Laser and Thompson method, and a final product was manufactured through a glass laminating process.

A picture of the product manufactured through the glass laminating process is shown in FIG. 35.

The invention claimed is:

1. A decoration element comprising:
a color developing layer including a light reflective layer; and a light absorbing layer provided on a surface of the light reflective layer; and
an in-mold label layer provided on one surface of the color developing layer,
wherein the light absorbing layer comprises a convex portion shape or a concave portion shape having an asymmetric cross-section,
wherein the light absorbing layer includes one or more selected from copper oxides, copper nitrides, copper oxynitrides, aluminum oxides, aluminum nitrides, aluminum oxynitrides and molybdenum titanium oxynitrides,
wherein the light absorbing layer has an extinction coefficient of greater than 0 and less than or equal to 4 at 400 nm, and
wherein a thickness of the light absorbing layer is from 5 nm to 500 nm.

2. The decoration element of claim 1, wherein the color developing layer further includes a color film provided on a surface of the light reflective layer opposite to the surface of the light reflective layer having the light absorbing layer provided thereon, between the light reflective layer and the light absorbing layer, or on a surface of the light absorbing layer opposite to a surface of the light absorbing layer having the light reflective layer provided thereon.

3. The decoration element of claim 1, wherein the color developing layer further includes a substrate provided on a surface of the light reflective layer opposite to the surface of the light reflective layer having the light absorbing layer provided thereon, or on a surface of the light absorbing layer opposite to a surface of the light absorbing layer having the light reflective layer provided thereon.

4. The decoration element of claim 1, wherein the light absorbing layer includes two or more points with different thicknesses.

5. The decoration element of claim 1, wherein the light absorbing layer includes one or more regions in which an upper surface has an inclined surface with an angle of inclination of greater than 0 degrees and less than or equal to 90 degrees, and
wherein the light absorbing layer includes one or more regions having a thickness different from a thickness in any one or more regions having the inclined surface.

6. The decoration element of claim 1, which has a dichroism of $\Delta E^*ab>1$.

7. The decoration element of claim 1, wherein an upper surface of the light absorbing layer includes a pattern having a cone-shaped protrusion or groove, a pattern having a protrusion in which the highest point has a line shape or a groove in which the lowest point has a line shape, or a pattern having a protrusion or groove with a structure in which the cone-shaped upper surface is cut.

8. The decoration element of claim 7, wherein, in the pattern having a cone-shaped protrusion or groove, two or less identical shapes are present when observed from an upper surface while rotating the cone-shaped pattern 360 degrees around a vertex of the cone.

9. The decoration element of claim 7, wherein, in the pattern having a protrusion in which the highest point has a line shape or a groove in which the lowest point has a line shape, only one identical shape is present when observed from an upper surface while rotating 360 degrees around a center of gravity of the upper surface.

10. The decoration element of claim 1, wherein the light absorbing layer has a refractive index of 0 to 8 at 400 nm.

11. The decoration element of claim 1, wherein the in-mold label layer includes one or more materials selected from the group consisting of acrylonitrile butadiene styrene (ABS), polymethyl methacrylate (PMMA), polycarbonate (PC), acrylonitrile-styrene (AS), styrene-acrylonitrile (SAN), polyethylene terephthalate (PET) and polypropylene (PP).

12. The decoration element of claim 1, which is a deco film or a case of a mobile device.

* * * * *